US012782455B2

(12) United States Patent
Yoshida et al.

(10) Patent No.: US 12,782,455 B2
(45) Date of Patent: Nov. 3, 2026

(54) BATTERY DIAGNOSTIC SYSTEM

(71) Applicant: DENSO CORPORATION, Kariya-city (JP)

(72) Inventors: Shuhei Yoshida, Kariya-city (JP); Kazuya Takizawa, Kariya-city (JP); Yuta Shimonishi, Kariya-city (JP); Hiroyoshi Yamamoto, Kariya-city (JP); Sho Nagashima, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 608 days.

(21) Appl. No.: 18/363,558

(22) Filed: Aug. 1, 2023

(65) Prior Publication Data

US 2023/0375637 A1 Nov. 23, 2023

Related U.S. Application Data

(63) Continuation of application No. PCT/JP2022/001292, filed on Jan. 17, 2022.

(30) Foreign Application Priority Data

Feb. 26, 2021 (JP) ................................ 2021-029387

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G16Y 20/20* (2020.01);
(Continued)

(58) Field of Classification Search
CPC .............. G01R 31/392; G01R 31/3648; G01R 31/367; G16Y 20/20; G16Y 40/20;
(Continued)

(56) References Cited

U.S. PATENT DOCUMENTS

2018/0080990 A1* 3/2018 Seo ...................... G01R 31/382
2018/0222343 A1 8/2018 Uchida
(Continued)

FOREIGN PATENT DOCUMENTS

JP 2013110891 A 6/2013
JP 2016057310 A 4/2016
(Continued)

OTHER PUBLICATIONS

U.S. Appl. No. 18/363,511, filed Aug. 1, 2023, Hiroyoshi Yamamoto et al.

*Primary Examiner* — Tung S Lau
(74) *Attorney, Agent, or Firm* — Harness, Dickey & Pierce, P.L.C.

(57) ABSTRACT

A battery diagnostic system includes an interpolation processing unit, a degradation estimation unit, a degradation prediction unit, and an output unit. When a part of the battery load history is missing, the interpolation processing unit interpolates the missing part using the rest of the constituent data. The degradation estimation unit estimates, based on the battery load history, a present degradation state of the secondary battery and a cause of degradation that has brought about the degradation state. The degradation prediction unit predicts, using a predicted battery load, the present degradation state and the cause of degradation of the secondary battery, a predicted degradation state of the secondary battery that will occur in the future upon having been used in the use mode. The output unit outputs the predicted degradation state of the secondary battery.

10 Claims, 14 Drawing Sheets

(51) Int. Cl.

| | |
|---|---|
| ***G16Y 20/20*** | (2020.01) |
| ***G16Y 40/20*** | (2020.01) |
| ***H01M 10/42*** | (2006.01) |

(52) U.S. Cl.
CPC ......... *G16Y 40/20* (2020.01); *H01M 10/4285* (2013.01); *H01M 2220/20* (2013.01)

(58) Field of Classification Search
CPC ......... H01M 10/4285; H01M 2220/20; H01M 10/42; H01M 10/48; G06Q 10/04; G06Q 50/10; H02J 7/00; Y02E 60/10
See application file for complete search history.

(56) References Cited

U.S. PATENT DOCUMENTS

| | | | | |
|---|---|---|---|---|
| 2020/0003839 | A1* | 1/2020 | Yamamoto .......... | G06F 16/2455 |
| 2020/0014238 | A1 | 1/2020 | Daniels | |
| 2021/0021000 | A1 | 1/2021 | Sada et al. | |

FOREIGN PATENT DOCUMENTS

| | | | |
|---|---|---|---|
| JP | 2017069011 | A | 4/2017 |
| JP | 2017111860 | A | 6/2017 |
| JP | 2018080803 | A | 5/2018 |
| JP | 2018128769 | A | 8/2018 |
| JP | 2020012528 | A | 1/2020 |
| JP | 2020054214 | A | 4/2020 |
| WO | WO 2005073742 | A1 * | 8/2005 |
| WO | WO-2016071941 | A1 | 5/2016 |
| WO | WO-2019/171688 | A1 | 9/2019 |

* cited by examiner

FIG. 10

| PREDICTED BATTERY LOAD | SOC CHANGE | INPUT/OUTPUT | TRAVEL DISTANCE |
|---|---|---|---|
| PREDICTED BATTERY LOAD (1) (450km/d) | 90%→42% | TRAVELING | 90km |
| | 42%→90% | QUICK CHARGE | — |
| | 90%→42% | TRAVELING | 90km |
| | 42%→90% | QUICK CHARGE | — |
| | 90%→42% | TRAVELING | 90km |
| | 42%→90% | QUICK CHARGE | — |
| | 90%→42% | TRAVELING | 90km |
| | 42%→90% | QUICK CHARGE | — |
| | 90%→42% | TRAVELING | 90km |
| | 42%→90% | NORMAL CHARGE | — |
| PREDICTED BATTERY LOAD (2) (150km/d) | 90%→10% | TRAVELING | 150km |
| | 10%→90% | NORMAL CHARGE | — |
| PREDICTED BATTERY LOAD (3) (100km/d) | 90%→34% | TRAVELING | 100km |
| | 34%→90% | NORMAL CHARGE | — |
| PREDICTED BATTERY LOAD (4) (LEARNING) | 90%→10% | TRAVELING | 150km |
| | 10%→90% | QUICK CHARGE | — |
| | 90%→34% | TRAVELING | 100km |
| | 34%→90% | NORMAL CHARGE | — |
| ⋮ | ⋮ | ⋮ | ⋮ |

BATTERY DIAGNOSTIC SYSTEM

CROSS REFERENCE TO RELATED APPLICATION

The present application is a continuation application of International Patent Application No. PCT/JP2022/001292 filed on Jan. 17, 2022, which designated the U.S. and claims the benefit of priority from Japanese Patent Application No. 2021-029387 filed on Feb. 26, 2021. The entire disclosures of all of the above applications are incorporated herein by reference.

TECHNICAL FIELD

The present disclosure relates to a battery diagnostic system configured to diagnose a degree of degradation of a secondary battery.

BACKGROUND ART

A secondary battery degrades with charge and discharge and the lapse of time, and the performance and value of the secondary battery degrade. A technique for diagnosing the degree of degradation of the secondary battery has been developed.

SUMMARY

A battery diagnostic system according to the present disclosure includes a load history acquisition unit, an interpolation processing unit, a degradation estimation unit, a degradation prediction unit, and an output unit. The load history acquisition unit acquires a battery load history which is a history of a load applied to a used secondary battery. The interpolation processing unit estimates and interpolates a portion of the missing constituent data using the rest of the constituent data when a portion of constituent data of the battery load history is missing. The degradation estimation unit estimates, on the basis of the battery load history, a present degradation state of the secondary battery and a cause of degradation that has brought about the degradation state. The degradation prediction unit performs diagnostics by predicting, using a predicted battery load indicating a load predicted to be applied to the secondary battery according to a future use mode of the secondary battery and the present degradation state and the cause of degradation of the secondary battery estimated by the degradation estimation unit, a predicted degradation state of the secondary battery that will occur in the future upon having been used in the use mode. The output unit outputs the predicted degradation state of the secondary battery having been predicted by the degradation prediction unit.

BRIEF DESCRIPTION OF DRAWINGS

The present disclosure will become more apparent from the following detailed description with reference to the accompanying drawings. In the accompanying drawings:

FIG. 10 is an explanatory diagram illustrating an example of a predicted battery load according to the first embodiment;

DESCRIPTION OF EMBODIMENTS

Figure 1:
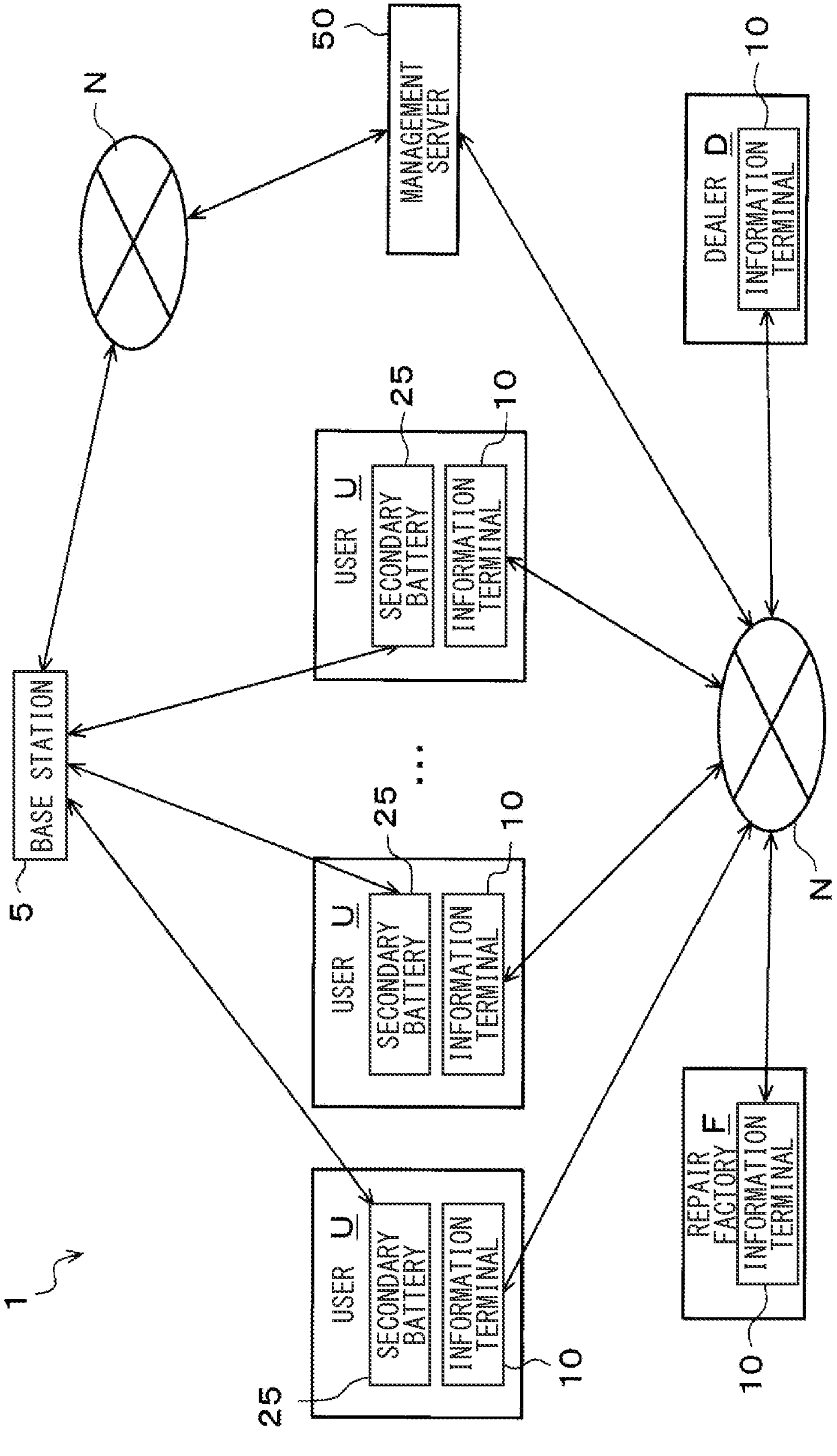
FIG. 1 is a schematic configuration diagram of a battery diagnostic system according to a first embodiment.

Conventionally, secondary batteries have been used in various applications such as in-vehicle applications including hybrid vehicles and electric vehicles, and home applications. Since a secondary battery degrades with charge and discharge and the lapse of time, and the performance and value of the secondary battery degrade, a technique for diagnosing the degree of degradation of the secondary battery has been developed.

As a technique related to a battery diagnostic system, a technique of a battery replacement support system is known. In the battery replacement support system, a future degradation state of a secondary battery after a predetermined period elapses is identified from a current capacity degradation state of the secondary battery, and the life of the secondary battery is evaluated.

Here, in the technique, the capacity degradation of the secondary battery is obtained as an actual measured value using AC resistance, and a future state of capacity degradation after a predetermined period elapses is identified by an extrapolation method based on the actual measured value. Degradation of a secondary battery includes various modes such as resistance degradation in addition to capacity degradation, and if the progress of degradation at the present time is different, the way of progress of degradation in the future will also be different.

That is, the future degradation state of the secondary battery is identified by the extrapolation method from the current mode of capacity degradation. Therefore, it is considered that the prediction of the future degradation state deviates from the actual situation.

The present disclosure provides a battery diagnostic system capable of diagnosing a future degradation state of a secondary battery with higher accuracy on the basis of a current degradation state of the secondary battery.

A battery diagnostic system according to the present disclosure includes a load history acquisition unit, an interpolation processing unit, a degradation estimation unit, a degradation prediction unit, and an output unit.

The load history acquisition unit acquires a battery load history which is a history of a load applied to a used secondary battery. The interpolation processing unit estimates and interpolates a portion of the missing constituent data using the rest of the constituent data when a portion of constituent data of the battery load history is missing. The degradation estimation unit estimates, on the basis of the battery load history, a present degradation state of the secondary battery and a cause of degradation that has brought about the degradation state.

The degradation prediction unit performs diagnostics by predicting, using a predicted battery load indicating a load predicted to be applied to the secondary battery according to a future use mode of the secondary battery and the present degradation state and the cause of degradation of the secondary battery estimated by the degradation estimation unit, a predicted degradation state of the secondary battery that will occur in the future upon having been used in the use mode. The output unit outputs the predicted degradation state of the secondary battery having been predicted by the degradation prediction unit.

With this configuration, when a portion of constituent data of a battery load history is missing, the interpolation processing unit estimates and interpolates a portion of the missing constituent data using the rest of the constituent data. Unlike the extrapolation method, in the interpolation processing, data filling the range of each section of a certain known data sequence is generated on the basis of the known data sequence, or such a function is given.

Therefore, in the battery diagnostic system, even when a portion of the constituent data of the battery load history is missing, the battery load history can be acquired with high accuracy. Further, in the battery diagnostic system, the present degradation state and the cause of degradation of the secondary battery are estimated using the accurate battery load history, and the predicted degradation state of the secondary battery to be generated in the future is predicted using the degradation state and cause of degradation and the predicted battery load. Therefore, according to the battery diagnostic system, even when a portion of the battery load history is missing, the future degradation state of the secondary battery can be diagnosed with higher accuracy on the basis of the degradation state of the secondary battery at the present time.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A first embodiment of the present disclosure will be described with reference to FIGS. 1 to 11. In the present embodiment, a battery diagnostic system 1 according to the present disclosure is applied to an industry in which a degradation state or the like of a secondary battery 25 owned by a user U is estimated and diagnosed to make a proposal regarding maintenance of the secondary battery 25.

Here, the secondary battery 25 includes, for example, a lithium ion secondary battery, and has battery cells connected in series with each other. The negative electrode of the secondary battery 25 is made of, for example, a negative electrode active material capable of occluding and releasing lithium ions such as graphite. The positive electrode of the secondary battery 25 can be, for example, a ternary electrode containing Ni, Mn, and Co, such as $LiNi_{1/3}Co_{1/3}Mn_{1/3}O_2$. In addition, as the electrode, an electrode made of a composite material may be adopted.

The secondary battery 25 includes, for example, a battery pack including battery modules respectively including battery cells arranged in a row. Therefore, the performance of the battery pack as the secondary battery 25 is affected by the battery module exhibiting the lowest performance among the battery modules. Further, the performance of the battery module is affected by the battery cell exhibiting the lowest performance among the battery cells included in the battery module. Therefore, in order to curb degradation of the secondary battery 25, it is important to perform maintenance in units of battery cells and in units of battery modules.

The battery diagnostic system 1 is configured to diagnose a remaining value of the secondary battery 25 in consideration of a future use mode of the secondary battery 25 in addition to the degradation degree and the cause of degradation of the secondary battery 25, and propose an effective maintenance method for increasing the remaining value to the user U.

As illustrated in FIG. 1, the battery diagnostic system 1 includes secondary batteries 25 owned by the users U thereof. In the following description, a case where the secondary battery 25 is used for driving an electric vehicle will be described as an example, but the application is not limited thereto. If a battery load history indicating load associated with use of the secondary battery 25 can be output to a management server 50, the battery load history can be used for various applications such as a household power supply and a factory power supply.

The battery load history which is use history information of each secondary battery 25 is transmitted to the management server 50 in a data center via a predetermined base station 5. For example, when the secondary battery 25 is mounted on a vehicle V, the battery load history is transmitted from a communication terminal 34 of the vehicle V to the management server 50. The battery load history includes a battery temperature T, a current value I, an SOC, and the like of the secondary battery 25.

An information terminal 10 is allocated to each user U. The information terminal 10 includes a tablet terminal, a smartphone, or the like, and is used to input a predicted battery load or the like indicating a future use application of the secondary battery 25 assumed by each user U. When the predicted battery load is transmitted from each information terminal 10, the predicted battery load is stored in a user database 55 of the management server 50 via a network N.

The management server 50 estimates the degradation degree and the configuration of the cause of degradation of the secondary battery 25 using the battery load history of each secondary battery 25. By using the estimated degradation degree and the configuration of the cause of degradation of each secondary battery 25 and the predicted battery load, the future degradation degree and the like of the secondary battery 25 when used with the predicted battery load is predicted.

Further, future handling (e.g., maintenance method or the like) of the secondary battery 25 is proposed in consideration of the future degradation degree and the like of the secondary battery 25. These diagnosis results and proposals are transmitted to the information terminal 10 of the user U via the network N.

As illustrated in FIG. 1, the battery diagnostic system 1 includes the information terminal 10 of a dealer D and the information terminal 10 of a repair shop F. In the information terminal of the dealer D, component cost, delivery date, and the like necessary for maintenance of the secondary battery 25 are input. In the information terminal 10 of the repair shop F, a labor fee required for maintenance, a work reservation status, and the like are input.

Since the battery diagnostic system 1 can identify the cost and period necessary for maintenance of the secondary battery 25 using the information input from the information terminals 10 of the dealer D and the repair shop F, it is possible to propose a maintenance method in consideration of the cost and period.

A configuration of the vehicle V in the battery diagnostic system 1 will be described with reference to FIG. 2. As described above, the vehicle V in the battery diagnostic system 1 is an electric vehicle equipped with the secondary battery 25 and which obtains driving force for traveling from a motor generator 20.

The vehicle V only needs to be a vehicle including the motor generator 20, and, for example, a hybrid vehicle that obtains driving force for traveling from the motor generator 20 and an internal combustion engine (engine) can also be adopted.

Figure 2:
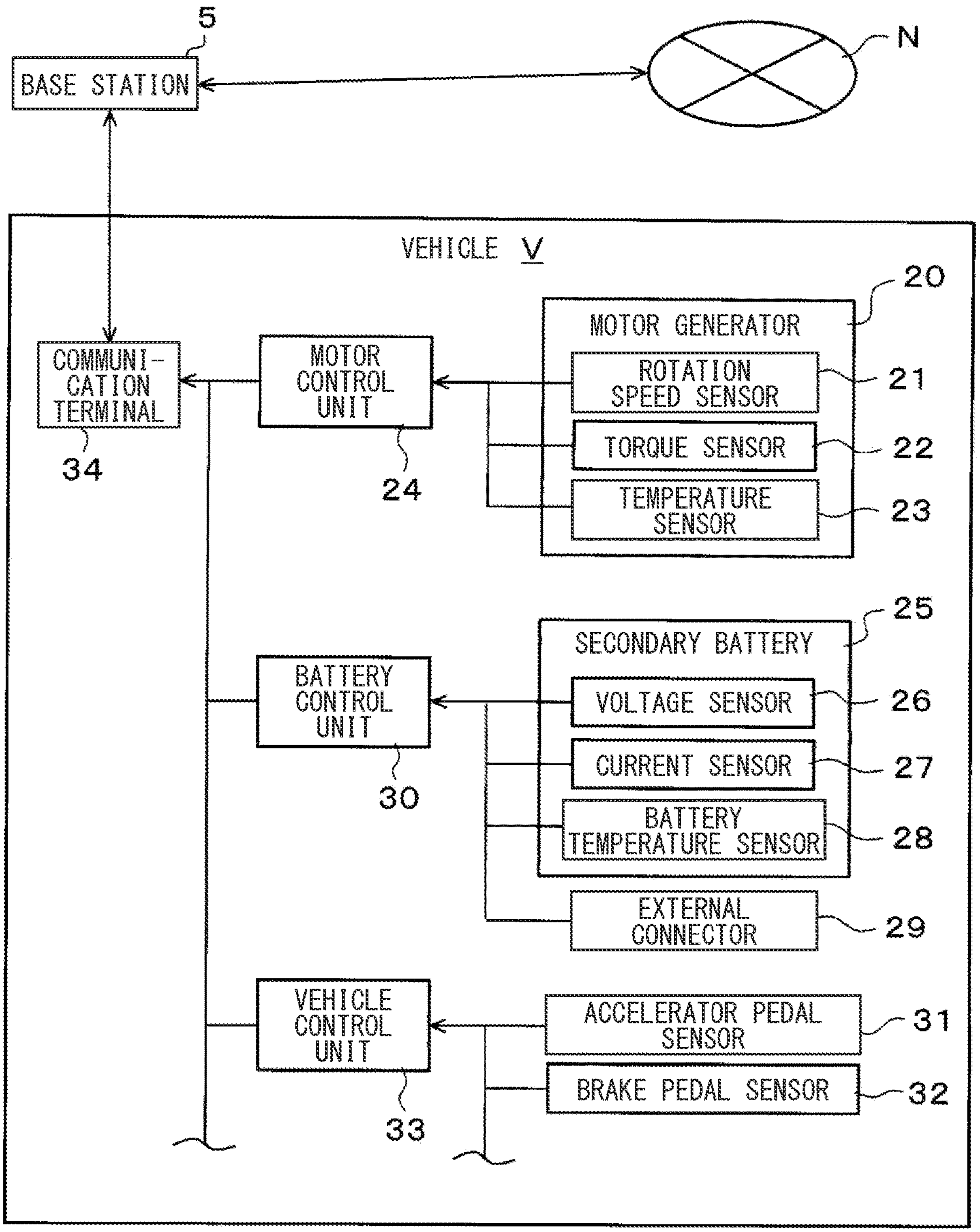
FIG. 2 is a configuration diagram of a vehicle in the battery diagnostic system.

As illustrated in FIG. 2, the motor generator 20 is mounted on the vehicle V as a drive source. A rotation speed sensor 21 that detects a motor rotational speed, a torque sensor 22 that detects a motor torque, a temperature sensor 23 that detects a motor temperature, and the like are attached to the motor generator 20.

The vehicle V is provided with a motor control unit 24 that controls a driving state of the motor generator 20. Vehicle information such as a motor rotational speed, a motor torque, and a motor temperature is input to the motor control unit 24 from the rotation speed sensor 21, the torque sensor 22, and the temperature sensor 23.

As described above, the secondary battery 25 is mounted on the vehicle V. The secondary battery 25 includes, for example, a lithium ion secondary battery, and supplies power to the motor generator 20 and supplies power to other in-vehicle devices. As the configuration of the secondary battery 25, a configuration in which battery cells are connected in parallel to each other to form a cell block, and the cell blocks are connected in series to each other may be adopted.

As illustrated in FIG. 2, a voltage sensor 26, a current sensor 27, and a battery temperature sensor 28 are connected to the secondary battery 25. The voltage sensor 26 detects a voltage value of the secondary battery 25. The current sensor 27 detects the current value I of the secondary battery 25. The battery temperature sensor 28 detects the battery temperature T of the secondary battery 25.

Each of the voltage sensor 26, the current sensor 27, and the battery temperature sensor 28 has detection units for the battery pack that is the secondary battery 25. That is, the voltage sensor 26, the current sensor 27, and the battery temperature sensor can detect the voltage value, the current value I, and the battery temperature T in units of battery modules included in the battery pack and in units of battery cells included in the battery module.

The secondary battery 25 is provided with an external connector 29. The external connector 29 is connectable to a power system outside the vehicle V. Therefore, the secondary battery 25 can supply the power of the secondary battery 25 to an external power system, and can receive power supply from an external power system to the secondary battery 25.

The vehicle V is provided with a battery control unit 30. Information such as the voltage value, the current value, and the battery temperature T from the voltage sensor 26, the current sensor 27, and the battery temperature sensor 28 described above is input to the battery control unit 30. These pieces of information form a battery load history described later. Therefore, the battery control unit 30 manages the use history and the like of the secondary battery 25. The battery control unit 30 controls a charge/discharge state of the secondary battery 25. That is, the battery control unit 30 forms a so-called battery management unit.

Further, the vehicle V is provided with a vehicle control unit 33. The vehicle control unit 33 integrally controls the entire vehicle V. An accelerator pedal sensor 31, a brake pedal sensor 32, and the like are connected to the vehicle control unit 33. Therefore, vehicle information such as an operation status of an accelerator pedal and a brake pedal is input to the vehicle control unit 33.

The information input to the motor control unit 24, the battery control unit 30, and the vehicle control unit 33 is output from the communication terminal 34 mounted on the vehicle control unit 33 to the management server 50 via the base station 5 and the network N.

The communication terminal 34 has a function of receiving radio waves from a GPS satellite (not illustrated), and can determine position information of the vehicle V using a global positioning system (GPS). Position information, speed information, and the like obtained from the GPS are also transmitted as information accompanying the battery load history from the communication terminal 34 to the management server 50 via the base station 5 and the network N.

While a mobile phone, a wireless LAN, or the like can be used for wireless communication between the communication terminal 34 and the base station 5, when a charging cable (not illustrated) is connected to the external connector 29 of the vehicle V, for example, various types of information may be transmitted by wired communication. In addition, the timing at which various types of information such as the battery load history are transmitted from the vehicle V to the management server 50 may be transmission in real time or may be collective transmission at a predetermined timing.

Figure 3:
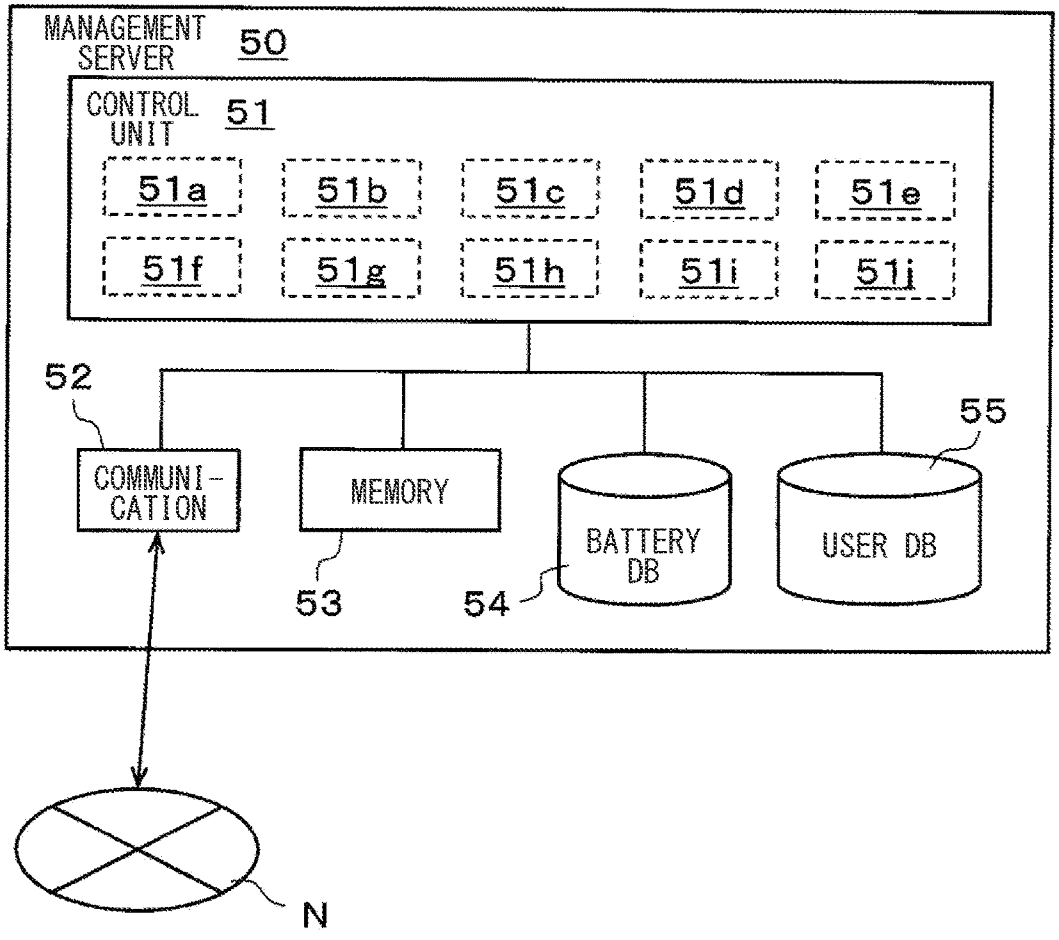
FIG. 3 is a configuration diagram of a management server in the battery diagnostic system.

Next, a configuration of the management server 50 in the battery diagnostic system 1 will be described with reference to FIG. 3. As illustrated in FIG. 3, the management server 50 includes a general server computer having a control unit 51, a communication unit 52, a storage device 53, and the like.

The management server 50 estimates and diagnoses a predicted future degradation state of the secondary battery 25 using a degradation state of the secondary battery 25 and a predicted battery load based on a future use plan. In addition, the management server 50 proposes a future handling mode (e.g., maintenance method) of the secondary battery 25 on the basis of the predicted degradation state and the like of the secondary battery 25 and a handling criteria related to future handling of the secondary battery 25.

The control unit 51 is configured by a known microcomputer including a CPU, a ROM, a RAM, and the like, and peripheral circuits thereof. The CPU of the control unit 51 executes a control program stored in the ROM to implement each functional unit in the battery diagnostic system 1. The communication unit 52 enables bidirectional communication of data with each vehicle V and each information terminal 10 via the network N. The storage device 53 is a memory that temporarily stores target data and temporarily stores a calculation result when the communication unit 52 transmits and receives data.

In addition, the management server 50 has a battery database 54 and the user database 55. The battery database 54 stores the battery load history transmitted from each secondary battery 25. The battery database 54 includes an element degradation state and a battery state calculated by battery management processing to be described later, in addition to information such as the battery temperature T and the current value I included in the battery load history. The battery database 54 also stores, for each secondary battery 25, battery characteristic information indicating characteristics related to the progress of degradation of the secondary battery 25.

The user database 55 stores user information input from the information terminal 10 of each user U. The user database 55 includes, as user information, information such as a history of a maintenance method for the secondary battery 25, a history of a handling criteria, and a history of the predicted battery load.

As illustrated in FIG. 3, the control unit 51 includes, as functional units of the battery diagnostic system 1, a load history acquisition unit 51*a*, an interpolation processing unit 51*b*, a degradation estimation unit 51*c*, a degradation prediction unit 51*d*, and an output unit 51*e*. Further, the control unit 51 includes, as functional units of the battery diagnostic system 1, a predicted load generation unit 51*f*, a remaining value evaluation unit 51*g*, a rank identifying unit 51*h*, a proposal unit 51*i*, and a condition input unit 51*j*.

The load history acquisition unit 51*a* is a functional unit that acquires a battery load history which is a history of loads on the used secondary battery 25, and is implemented by, for example, the control unit 51 when executing step S1 described later.

The interpolation processing unit 51*b* is a functional unit that, when a portion of the constituent data of the battery load history is missing, estimates and interpolates a portion of the missing constituent data using the rest of the constituent data. The interpolation processing unit 51*b* is implemented by, for example, the control unit 51 when executing step S23 described later.

The degradation estimation unit 51*c* is a functional unit that estimates, on the basis of the battery load history, the present degradation state of the secondary battery 25 and the cause of degradation that has brought about the degradation state, and is implemented by, for example, the control unit 51 when executing processing from step S2 to step S4 described later.

The degradation prediction unit 51*d* is a functional unit that performs diagnostics by predicting, using the predicted battery load indicating a load predicted to be applied to the secondary battery 25 according to a future use mode of the secondary battery 25 as well as the present degradation state and the cause of degradation of the secondary battery 25, the predicted degradation state of the secondary battery 25 that will occur in the future. The degradation prediction unit is implemented by, for example, the control unit 51 when executing step S7 described later.

The output unit 51*e* is a functional unit that outputs the predicted degradation state of the secondary battery 25, and is implemented by, for example, the control unit 51 when executing step S11 described later.

The predicted load generation unit 51*f* is a functional unit that, when the secondary battery 25 is used according to a future use mode of the secondary battery 25, identifies a load predicted to be applied to the value of the secondary battery 25 and generates the predicted battery load. The predicted load generation unit 51*f* is implemented by, for example, the control unit 51 when executing step S6 described later.

The remaining value evaluation unit 51*g* is a functional unit that evaluates the remaining value of the secondary battery 25 when used in a future use mode using the predicted degradation state of the secondary battery 25, and is implemented by, for example, the control unit 51 when executing step S9 described later.

The rank identifying unit 51*h* is a functional unit that ranks the secondary battery 25 with respect to the predicted degradation state of the secondary battery 25 by using the predicted state of the battery components of the secondary battery 25. The rank identifying unit 51*h* is implemented by, for example, the control unit 51 when executing step S8 described later.

The proposal unit 51*i* is a functional unit that proposes a future handling mode of the secondary battery that can increase the remaining value of the secondary battery by using the evaluated remaining value of the secondary battery 25 and the handling criteria related to future handling of the secondary battery 25. The proposal unit 51*i* is implemented by, for example, the control unit 51 when executing step S10 described later.

The condition input unit 51*j* is a functional unit to which a handling criteria related to future handling of the secondary battery 25 is input, and is implemented by, for example, the control unit 51 when executing step S5 described later.

At least one of the functions of the battery diagnostic system 1 may be configured by an electronic circuit (i.e., hardware) for performing the function.

Next, a processing step of the battery diagnosis processing by the battery diagnostic system 1 according to the first embodiment will be described with reference to FIGS. 4 and 5. Here, in the battery diagnostic system 1 according to the first embodiment, calculation processing of the element degradation state, the battery state, the predicted element degradation state, and the predicted battery state is performed in units of battery modules included in the secondary battery 25.

Depending on the balance between the processing load for the processing of calculating the element degradation state and the like and the performance and required time of the control unit 51 of the management server 50, the processing of calculating the element degradation state and the like may be performed in units of battery packs included in the secondary battery 25. If there is a margin in the performance and required time of the control unit 51, the processing of calculating the element degradation state and the like can be performed in units of battery cells included in the battery module.

Figure 4:
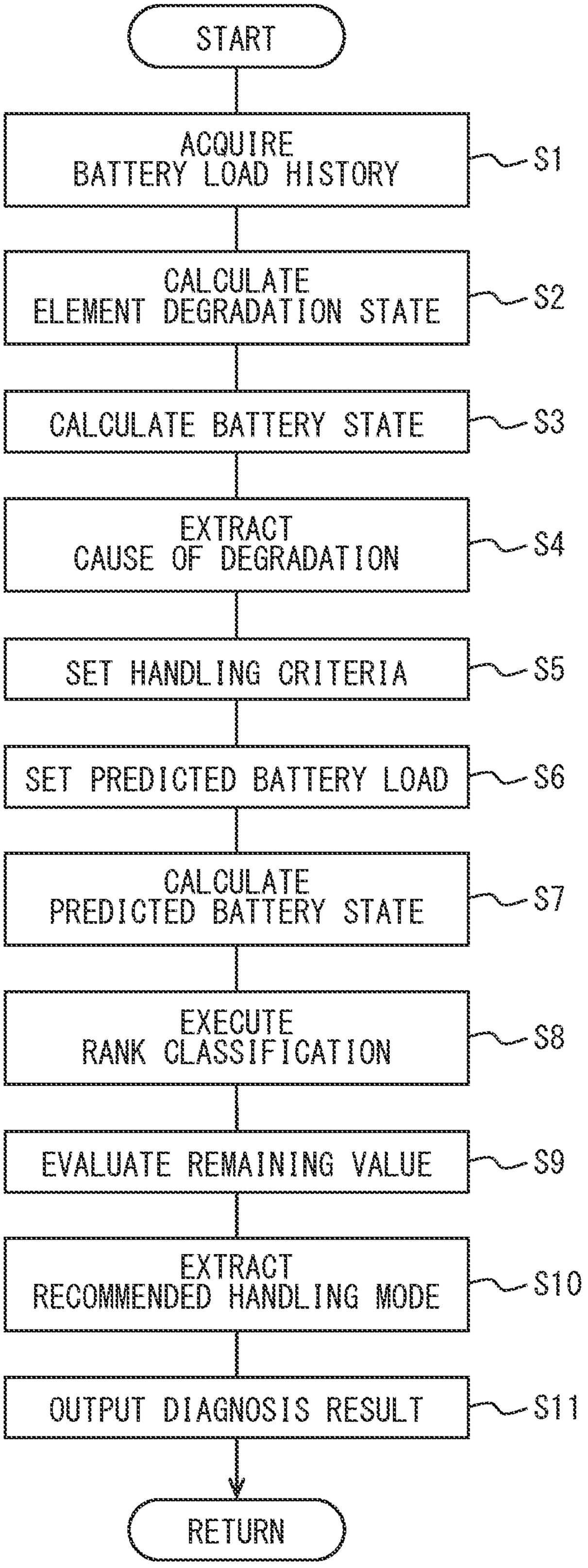
FIG. 4 is a flowchart of battery diagnosis processing in the battery diagnostic system.
Figure 5:
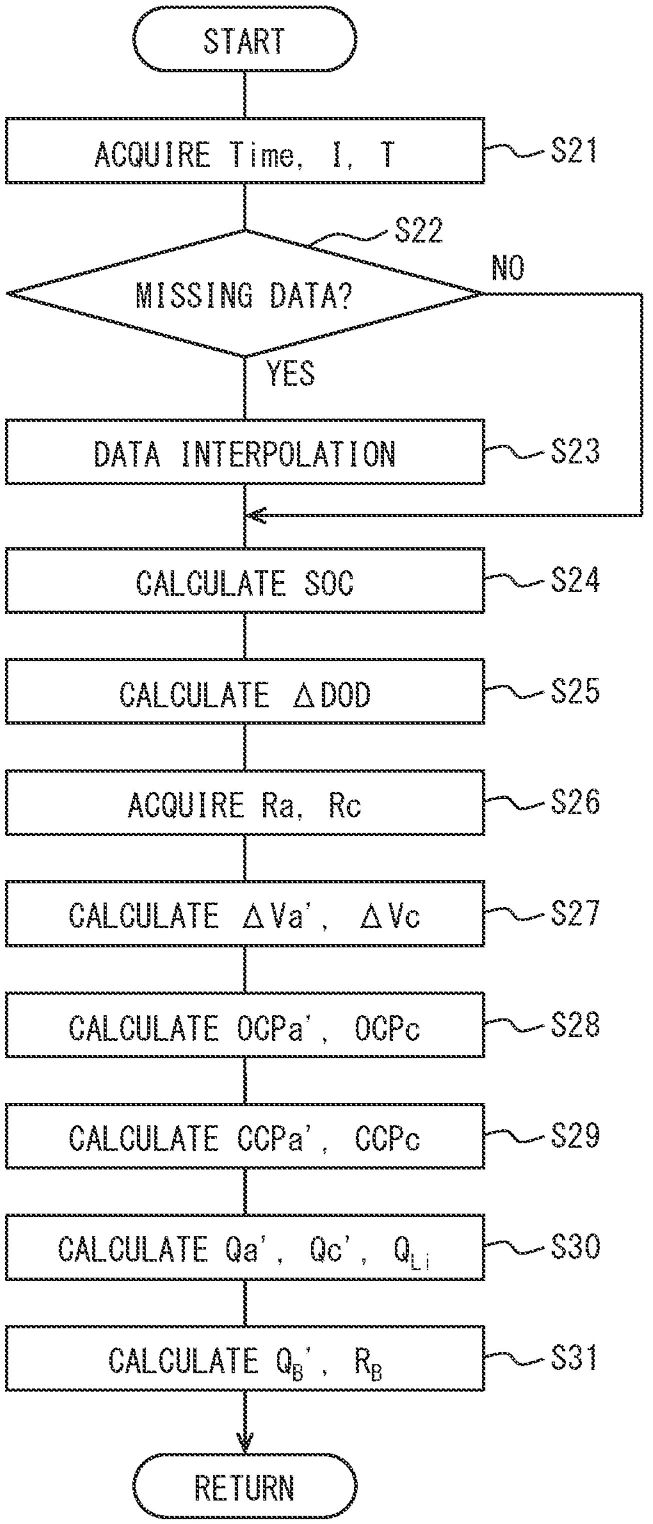
FIG. 5 is a flowchart related to calculation of a battery state in battery diagnosis processing.

As illustrated in FIG. 4, in step S1, the battery diagnostic system 1 acquires a battery load history of the secondary battery 25 included in the battery diagnostic system 1. In the case of the secondary battery 25 of the vehicle V, the control unit 51 is acquired by the communication unit 52 via the communication terminal 34 of the vehicle V, the base station 5, and the network N. At this time, the battery load history of the secondary battery 25 may be acquired from the battery database 54. Thus, the battery diagnostic system 1 can acquire the battery load history of the secondary battery 25 without disassembling the secondary battery 25 (i.e., battery pack and battery module).

The battery load history includes a history of loads acting on the secondary battery 25, such as the battery temperature T, which is a temperature of the secondary battery 25, a charge/discharge current, and a use period. In a case where data forming the battery load history is missing due to a standing period or the like, the control unit 51 performs interpolation processing of interpolating a missing portion using an existing value. The content of the interpolation processing will be described later.

When the processing proceeds to step S3, element degradation states $SOHQ_ae$, $SOHQ_ce$, $SOHQ_{Li}e$, $SOHR_ae$, and $SOHR_ce$ of the secondary battery 25 as the target battery are calculated using the acquired battery load history. SOH stands for state of health.

$SOHQ_ae$ is a capacity retention rate of the negative electrode of the secondary battery 25 at the present time. $SOHQ_ce$ is a capacity retention rate of the positive electrode of the secondary battery 25 at the present time. $SOHQ_{Li}e$ is the capacity retention rate of the electrolyte of the secondary battery 25 at the present time. $SOHR_ae$ is a resistance increase rate of the negative electrode of the secondary battery 25 at the present time. $SOHR_ce$ is a resistance increase rate of the positive electrode of the secondary battery 25 at the present time. In the first embodiment, the element degradation states are calculated in units of battery modules included in the battery pack of the secondary battery 25.

The capacity retention rate of each component (i.e., negative electrode, positive electrode, and electrolyte) of the secondary battery 25 at a predetermined time (arbitrary time after start of use) is a ratio of the capacity of each component of the secondary battery 25 at the predetermined time to the capacity of each component in the initial state (e.g., at time of factory shipment). The negative electrode capacity corresponds to the number of sites of the negative electrode into which lithium ions can be inserted. The positive electrode capacity corresponds to the number of sites of the positive electrode into which lithium ions can be inserted.

The capacity of the electrolyte is expressed by using the positive-negative electrode SOC deviation capacity. The positive-negative electrode SOC deviation capacity is a deviation between used capacity regions of the positive electrode and the negative electrode in the secondary battery 25. The positive-negative electrode SOC deviation capacity corresponds to the number of lithium ions that can move between the positive electrode and the negative electrode and ease of movement of all lithium ions.

The resistance increase rate of each component of the secondary battery 25 at a predetermined time (arbitrary time after temporary use is started) is a ratio of the resistance value of each component of the secondary battery 25 at the predetermined time to the resistance value of each component in the initial state.

The battery diagnostic system 1 calculates each of the element degradation states $SOHQ_ae$, $SOHQ_ce$, $SOHQ_{Li}e$, $SOHR_ae$, and $SOHR_ce$ on the basis of a plurality of causes of degradation related to each battery component. That is, the battery diagnostic system 1 calculates the element degradation states $SOHQ_ae$ and $SOHR_ae$ related to the negative electrode on the basis of the plurality of causes of degradation of the negative electrode of the secondary battery 25. In addition, the battery diagnostic system 1 calculates the element degradation states $SOHQ_ce$ and $SOHR_ce$ related to the positive electrode on the basis of a plurality of causes of degradation of the positive electrode. Further, the battery diagnostic system 1 calculates the element degradation state $SOHQ_{Li}e$ related to the electrolyte on the basis of a plurality of causes of degradation of the electrolyte.

Specifically, each of a negative electrode capacity Qa and a negative electrode resistance Ra is calculated in consideration of a cause of degradation brought about by formation of a film on the surface of the active material, a cause of degradation brought about by cracking of the film formed on the surface of the active material, and a cause of degradation brought about by cracking of the active material itself.

Each of a positive electrode capacity Qc and a positive electrode resistance Rc is calculated in consideration of a cause of degradation brought about by the alteration of the surface of the active material, a cause of degradation brought about by cracking of the altered surface of the active material, and a cause of degradation in consideration of cracking of the active material itself.

In addition, the element degradation state $SOHQ_{Li}e$ of the electrolyte is calculated in consideration of a cause of degradation brought about by formation of a film on the surface of the active material of the negative electrode, a cause of degradation brought about by cracking of the film formed on the surface of the active material of the negative electrode, and a cause of degradation brought about by cracking of the active material itself of the negative electrode. Further, the element degradation state $SOHQ_{Li}e$ of the electrolyte is calculated in consideration of a cause of degradation brought about by formation of a film on the surface of the active material of the positive electrode, a cause of degradation brought about by cracking of the film formed on the surface of the active material of the positive electrode, and a cause of degradation brought about by cracking of the active material itself of the positive electrode.

A detailed method of calculating each element degradation state will be described later.

In step S4, battery states $SOHQ_Be$ and $SOHR_Be$, which are degradation states of the entire secondary battery 25, are calculated. The battery state $SOHQ_Be$ indicates a degradation state of the entire secondary battery 25 related to the capacity of the secondary battery 25. The battery state $SOHQ_Be$ is derived by taking the minimum value of the element degradation states $SOHQ_ae$, $SOHQ_ce$, and $SOHQ_{Li}e$ calculated in step S3. That is, $SOHQ_Be=\min(SOHQ_ae, SOHQ_ce, SOHQ_{Li}e)$.

As described above, the negative electrode capacity Qa corresponds to the number of sites of the negative electrode into which lithium ions can be inserted, and the positive electrode capacity Qc corresponds to the number of sites of the positive electrode into which lithium ions can be inserted. A positive-negative electrode SOC deviation capacity QLi corresponds to the number of lithium ions that can move between the positive electrode and the negative electrode and ease of movement of all lithium ions.

Therefore, the smallest one of the negative electrode capacity Qa, the positive electrode capacity Qc, and the positive-negative electrode SOC deviation capacity QLi corresponds to a battery capacity QB of the secondary battery 25. That is, the minimum value of the element degradation states $SOHQ_ae$, $SOHQ_ce$, and $SOHQ_{Li}e$ becomes the battery state $SOHQ_Be$ of the entire secondary battery 25.

In addition, the battery state $SOHR_Be$ indicates a degradation state of the entire secondary battery 25 related to resistance. The battery state $SOHR_Be$ is calculated by the sum of the element degradation states $SOHR_a e$ and $SOHR_c e$. That is, $SOHR_B e = SOHR_a e + SOHR_c e$.

In the first embodiment, the battery states $SOHQ_B e$ and $SOHR_B e$ are calculated in units of battery modules. For example, in a case where the resistance of a member (e.g., electrolyte) other than the electrode (i.e., negative electrode and positive electrode) of the secondary battery 25 is considered for the element degradation state, the element degradation state regarding the member is considered when the battery state $SOHR_B e$ is calculated. That is, the element degradation state related to the member is added to the right side of $SOHR_B e = SOHR_a e + SOHR_c e$.

Here, the acquisition of the battery load history in step S1, the calculation of the element degradation state in step S2, and the calculation of the battery state in step S3 will be described in detail with reference to FIG. 5.

The battery diagnostic system 1 sequentially calculates the element degradation state of the secondary battery 25 from the start of use up to the present time on the basis of the battery load history of the secondary battery 25. Hereinafter, the start time of one operation of calculating the element degradation state is referred to as ts, the end time thereof is referred to as te, and the time from the start time ts to the end time te is referred to as an execution cycle. The length of the execution cycle is appropriately determined in consideration of the accuracy of prediction regarding the element degradation state and the battery state and the calculation load regarding calculation of the element degradation state and the battery state.

As described above, in step S1, the control unit 51 acquires the battery load history of the secondary battery 25. A specific content of step S1 will be described with reference to steps S21 to S23.

In step S21, the battery temperature T, the charge-discharge current value I, and a history target period Time are acquired as the battery load history.

At this time, the battery diagnostic system 1 calculates the battery temperature T of the secondary battery 25 in the execution cycle from the temperature distribution of the secondary battery 25 during the execution cycle. The battery temperature T can be, for example, an average value calculated from a frequency distribution of the temperature of the secondary battery 25 acquired during the execution cycle.

As the battery temperature T, it is also possible to adopt an average value or the like of temperatures of the secondary battery 25 acquired during the execution cycle in order to reduce the calculation load. The battery temperature T is stored in the battery database 54 of the battery diagnostic system 1.

In step S22, the control unit 51 determines whether or not a portion of the constituent data of the battery load history is missing. Here, the battery load history of the secondary battery 25 includes a use period Pe in which the ignition of the vehicle V is on and there is input and output to and from the secondary battery 25, and a standing period Pel in which the ignition is off and there is no input or output to or from the secondary battery 25.

In the standing period Pel, since a detection operation of various sensors such as the battery temperature sensor 28 is not performed, it is conceivable that the battery load history corresponding to the standing period Pel included in the history target period Time may be missing. However, in order to evaluate the progress of calendar degradation described later, the battery load history of the standing period Pel is also required.

Therefore, in step S22, it is determined whether or not the constituent data acquired as the battery load history includes data (i.e., missing data) corresponding to the standing period Pel. If there is missing constituent data, the processing proceeds to step S23, and interpolation processing is performed. If there is no missing constituent data, the processing proceeds to step S24.

In step S23, data interpolation processing is performed to interpolate missing constituent data in the battery load history. In the data interpolation processing in step S23, data corresponding to the standing period Pel is estimated and complemented from data corresponding to the use period Pe acquired as the battery load history, and the battery load history in all periods is acquired.

Specifically, in step S23, data interpolation processing is performed on the voltage, the SOC, the current, and the battery temperature T included in the battery load history. In the following description, the use period Pe immediately before the standing period Pel is referred to as an immediately preceding use period Peb, and the use period Pe immediately after the standing period Pel is referred to as an immediately following use period Pea.

In the data interpolation processing related to the voltage and the SOC, the numerical value of the voltage or the like in the standing period Pel is linearly interpolated using the numerical value of the voltage or the like at the end of the immediately preceding use period Peb and the numerical value of the voltage or the like in the immediately following use period Pea. In the interpolation processing related to the current value I, since there is no input or output to or from the secondary battery 25, the current value I in the standing period Pel is estimated to be "0" and interpolation is performed.

Figure 6:
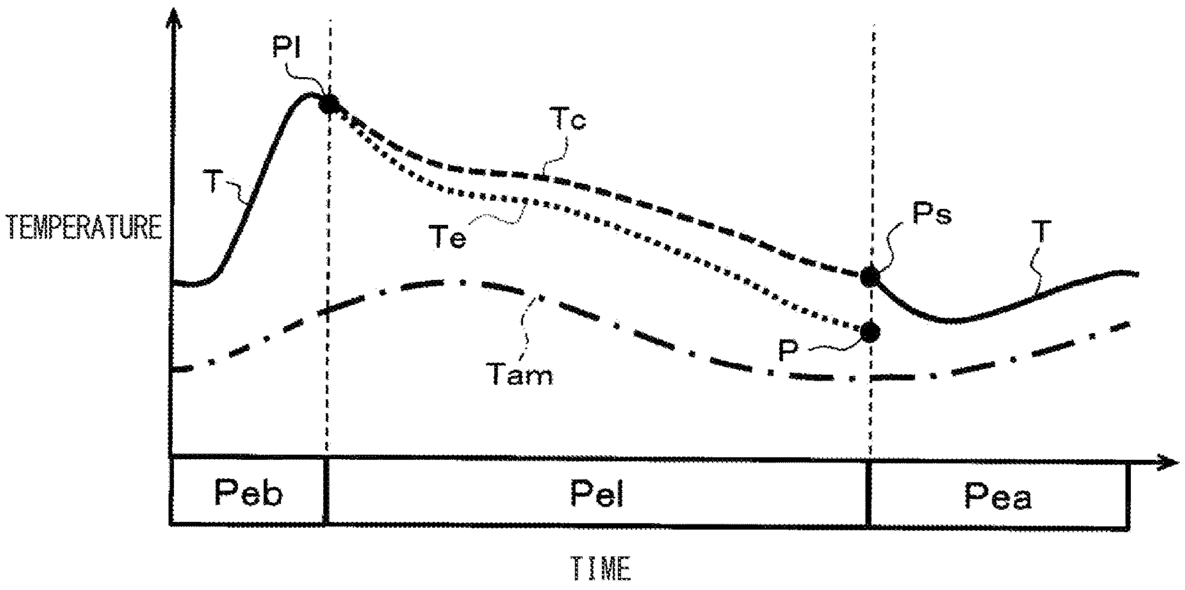
FIG. 6 is an explanatory diagram related to interpolation processing of a battery load history.

The content of the data interpolation processing related to the battery temperature T will be described with reference to FIG. 6. As illustrated in FIG. 6, the value of the battery temperature T at point PI at the end of the immediately preceding use period Peb and the value of the battery temperature T at point Ps at the start of the immediately following use period Pea are known.

An outside air temperature Tam around the secondary battery 25 in the standing period Pel can be acquired through the network N or the like, and is a known value for the entire the standing period Pel. Data sampling in the standing period Pel is performed N times in a sampling cycle Δt. Therefore, the length of the standing period Pel can be expressed as ΔtN.

First, in the standing period Pel, the relationship between the battery temperature $T_n$ related to the n-th sampling and the battery temperature $T_{n-1}$ related to the (n−1) th sampling can be expressed by the following formula (1).

[Mathematical formula 1]

$$T_n = T_{n-1} + \Delta T_n \tag{1}$$

Here, $\Delta T_n$ is a change amount of the battery temperature T from the time point of the (n−1) th sampling to the time point of the n-th sampling. Here, $\Delta T_n$ can be expressed as the following formula (2) in consideration of the outside air heat dissipation resistance of the secondary battery 25, the heat capacity of the secondary battery 25, and the outside air temperature Tam around the secondary battery 25.

[Mathematical Formula 2]

$$\Delta T_n = \frac{(T_{n-1} - Tam_{n-1})}{R} \times \frac{\Delta t}{C} \quad (2)$$

In formula (2), R represents the outside air heat dissipation resistance of the secondary battery 25, and C represents the heat capacity of the secondary battery 25. In addition, $Tam_{n-1}$ is the outside air temperature Tam at the time of the (n−1) th sampling. Since these values are known values, it is possible to derive a temperature profile Te in consideration of the outside air temperature Tam, the outside air heat dissipation resistance and the heat capacity of the secondary battery 25 by formulae (1) and (2).

Using the derived temperature profile Te and the value (actual measured value) of a battery temperature Ts at point Ps at the start of the immediately following use period Pea, the temperature profile Te is corrected in proportion to time. A correction value Tc can be expressed by the following formula (3).

[Mathematical Formula 3]

$$Tc_n = T_n + (Ts - T_N) \times \frac{\Delta tn}{\Delta tN} \quad (3)$$

In formula (3), $Tc_n$ represents a value of the correction value Tc corresponding to the n-th sampling time point. In addition, $T_N$ is a value of the temperature profile Te at the start point of the immediately following use period Pea, and represents point P in FIG. 6.

As described above, by performing the data interpolation processing in step S23, the battery temperature T in the standing period Pel can be accurately interpolated in consideration of the outside air heat dissipation resistance and heat capacity of the secondary battery 25 and the outside air temperature Tam around the secondary battery 25. By performing the data interpolation processing in step S23, the battery diagnostic system 1 can acquire a battery load history with high accuracy.

In step S24, the battery diagnostic system 1 calculates an integrated value of the current value I of the secondary battery 25, and calculates the state of charge of the secondary battery 25 on the basis of the calculated integrated value. The state of charge is a ratio of the remaining capacity to the full charge capacity of the secondary battery 25 expressed in percentage, and is the so-called SOC (i.e., state of charge). Hereinafter, the state of charge of the secondary battery 25 is referred to as SOC. The battery diagnostic system 1 calculates the SOC of the secondary battery 25 on the basis of the integrated value of the current value of the secondary battery 25 using, for example, a current integration method. Calculation of the element degradation state in step S2 and calculation of the battery state in step S3 are achieved by the processing in steps S24 to S31.

In step S25, the battery diagnostic system 1 calculates ΔDOD. Here, ΔDOD is calculated by a difference between the SOC at the start time is of the execution cycle and the SOC at the end time to thereof. DOD stands for depth of discharge indicating the depth of discharge of the secondary battery 25.

In step S26, the battery diagnostic system 1 calculates the negative electrode resistance $R_a$ and the positive electrode resistance $R_c$ of the secondary battery 25. The negative electrode resistance $R_a$ is calculated on the basis of the battery temperature T of the secondary battery 25, the current value I of the secondary battery 25, the change amount ΔDOD of the SOC, and the closed circuit potential of the negative electrode of the secondary battery 25. The positive electrode resistance $R_c$ is calculated on the basis of the battery temperature T of the secondary battery 25, the current value I of the secondary battery 25, the change amount ΔDOD of the SOC, and the closed circuit potential of the positive electrode.

Here, the battery temperature T is the battery temperature T of the secondary battery 25 acquired as the battery load history. The current value I is a current value I of the secondary battery 25 acquired as the battery load history. The change amount ΔDOD is ΔDOD calculated in step S25.

The closed circuit potential of the negative electrode and the closed circuit potential of the positive electrode of the secondary battery 25 are the closed circuit potentials of the negative electrode and the positive electrode of the secondary battery 25 calculated in the previous execution cycle. Hereinafter, the closed circuit potential of the negative electrode of the secondary battery 25 is referred to as $CCP_a$, and the closed circuit potential of the positive electrode of the secondary battery 25 is referred to as $CCP_c$. CCP stands for closed circuit potential.

The negative electrode resistance $R_a$ can be expressed as a function of the battery temperature T of the secondary battery 25, the negative electrode side closed circuit potential $CCP_a$, the change amount ΔDOD, and the charge-discharge current value I. The positive electrode resistance $R_c$ can be expressed as a function of the temperature T of the secondary battery 25, the positive electrode side closed circuit potential $CCP_c$, the change amount ΔDOD, and the charge-discharge current value I. A specific description will be given below.

The negative electrode resistance $R_a$ increases due to formation of a film (solid electrolyte interface (SEI)) on the surface of the negative electrode by oxidation-reduction decomposition of the electrolytic solution of the secondary battery 25 and additives thereof. Since the film is generated by the above-described chemical reaction, the negative electrode resistance $R_a$ follows the Arrhenius law. Therefore, the negative electrode resistance Ra can be expressed by a function of the battery temperature T.

In addition, since the film formation on the surface of the negative electrode is caused by oxidation-reduction, the film formation follows the Tafel's law. Therefore, the negative electrode resistance $R_a$ can be expressed by a function of the negative electrode side closed circuit potential $CCP_a$.

When the charge-discharge cycle of the secondary battery 25 is repeated, expansion and contraction of the active material of the negative electrode are repeated, and cracking of the surface film progresses, so that the negative electrode surface is eventually exposed from the crack of the film. Since a new film is formed on the surface exposed from the crack, the film amount increases, which causes a further increase in the negative electrode resistance $R_a$. The larger the change amount ΔDOD, the larger the degree of expansion and contraction of the active material. Therefore, the negative electrode resistance $R_a$ can be expressed by a function of the change amount ΔDOD.

In addition, in the negative electrode, due to repeated expansion and contraction of the active material, the active material itself cracks and the diameter thereof decreases. Cracking of the active material itself includes both an element for decreasing the negative electrode resistance $R_a$ and an element for increasing the negative electrode resistance $R_a$.

First, a new surface (i.e., surface on which film is not formed) is formed on the active material due to cracking of the active material itself, so that the reaction area increases. Therefore, cracking of the active material itself causes a decrease in the negative electrode resistance $R_a$. On the other hand, when a new surface is formed on the active material, film formation is promoted on the new surface, so that the film amount increases and the negative electrode resistance $R_a$ increases. In consideration of the above, the negative electrode resistance $R_a$ can be expressed by a function of the change amount ΔDOD from the following theory.

The pulverization rate, which is the rate of cracking of the active material of the negative electrode, is expressed by dr/dt when the particle size of the active material is r and the time is t. Here, it is considered that the pulverization rate dr/dt is more likely to proceed as the particle size r of the active material is larger. That is, the pulverization rate dr/dt can be considered to be proportional to the particle size r of the active material. Therefore, the pulverization rate dr/dt can be expressed by the following formula (4).

[Mathematical Formula 4]

$$\frac{dr}{dt} = -k \times r \tag{4}$$

In formula (4), k is a constant, and hereinafter may be referred to as a pulverization coefficient. When this is solved, the following formula (5) is obtained.

[Mathematical formula 5]

$$\ln(r) = -k \times t + \alpha \tag{5}$$

In formula (5), α is a constant.

Further, since the degree of expansion and contraction of the active material increases as the change amount ΔDOD of the active material increases, it is considered that the pulverization constant is proportional to the change amount ΔDOD. Then, the following formula (6) holds.

[Mathematical formula 6]

$$\ln(k) = \beta \times \Delta DOD + \gamma \tag{6}$$

In formula (6), β and γ are constants. When this is solved, the following formula (7) is obtained.

[Mathematical formula 7]

$$k = \eta \times \exp(\zeta \times \Delta DOD) \tag{7}$$

In formula (7), η and ζ are constants. When formula (5) and formula (7) are coupled, the following formula (8) can be derived.

[Mathematical formula 8]

$$r(t, \Delta DOD) = r_0\{1 - A \times \exp[B \times \langle \exp(C \times \Delta DOD) \rangle \times t]\} \tag{8}$$

$$f(t, \Delta DOD) \equiv A \times \exp[B \times \langle \exp(C \times \Delta DOD) \rangle \times t] \tag{9}$$

Here, $r_0$ is a radius of the active material at an initial stage (i.e., when t=0), and A, B, and C are constants. As described above, the negative electrode resistance $R_a$ increases due to the formation of the film on the surface of the negative electrode, and the formation rate of the film on the surface of the negative electrode has a correlation with the diameter of the active material of the negative electrode. Therefore, the negative electrode resistance $R_a$ can be expressed by a formula (i.e., function of ΔDOD) including a pulverization function f (t, ΔDOD). Each parenthesis on the right side of formula (5) may be further added and corrected with a constant.

The cracking of the surface film of the negative electrode and the cracking of the negative electrode active material itself also depend on the charge-discharge current value I of the secondary battery 25. As the charge-discharge current value I increases, the current tends to intensively flow through a low resistance portion of the active material, so that the degree of expansion and contraction may vary depending on the portion of the active material. As a result, strain is likely to occur in the active material, which causes cracking of the surface film of the negative electrode and cracking of the negative electrode active material itself.

Therefore, the cracking of the negative electrode surface film and the cracking of the negative electrode active material itself can be expressed by a function of the charge-discharge current value I or a function of the C rate correlated with the charge-discharge current value I. Here, the 1C rate indicates a current value at which the rated capacity of the battery is fully charged or fully discharged in one hour in the case of constant current charge/discharge measurement.

To summarize the above, the negative electrode resistance $R_a$ is expressed by the following formula (7) using a function $g_A$ (T, $CCP_a$), a function $g_B$ (T, $CCP_a$, ΔDOD, I), and a function $g_C$ (T, $CCP_a$, ΔDOD, I).

Here, the function $g_A$ (T, $CCP_a$) is a function considering that a film is formed on the surface of the active material. The function $g_B$ (T, $CCP_a$, ΔDOD, I) is a function in consideration of cracking of the film formed on the surface of the active material. The function $g_C$ (T, $CCP_a$, ΔDOD, I) is a function in consideration of cracking of the active material itself.

[Mathematical formula 9]

$$R_a = g_A(T, CCP_a) \times g_B(T, CCP_a, \Delta DOD, I) \times g_C(T, CCP_a, \Delta DOD, I) \tag{10}$$

On the basis of the above theory, the negative electrode resistance Ra is expressed as a function of the battery temperature T of the secondary battery 25, the negative electrode side closed circuit potential $CCP_a$, the change amount ΔDOD, and the charge-discharge current value I.

Next, the positive electrode resistance $R_c$ will be described. The positive electrode resistance $R_c$ increases as the surface of the positive electrode is altered. Since the surface of the positive electrode is altered by a chemical reaction, the positive electrode resistance $R_c$ follows the Arrhenius law. Therefore, the positive electrode resistance Rc can be expressed by a function of the battery temperature T.

In addition, since the alteration of the surface of the positive electrode is caused by reductive decomposition of the surface of the positive electrode, the alteration follows the Tafel's law. Therefore, the positive electrode resistance $R_c$ can be expressed by a function of the positive electrode side closed circuit potential $CCP_c$.

When the charge-discharge cycle of the secondary battery 25 is repeated and the expansion and contraction of the active material of the positive electrode are repeated, a crack occurs on the surface of the altered positive electrode active material, and a new positive electrode surface that is not altered is formed. The alteration eventually occurs on the new positive electrode surface, thereby causing a further increase in the positive electrode resistance $R_c$. Since the degree of expansion and contraction of the active material increases as the change amount ΔDOD increases, the positive electrode resistance $R_c$ can be expressed by a function of the change amount ΔDOD.

In addition, the alteration of the surface of the positive electrode is promoted by repeated expansion and contraction of the active material of the positive electrode, so that cracking of the active material of the positive electrode progresses, and the diameter of the active material decreases. Cracking of the active material itself includes both an element for decreasing the positive electrode resistance $R_c$ and an element for increasing the positive electrode resistance $R_c$.

First, since a new surface (i.e., surface before alteration) is formed on the active material by cracking of the active material itself, the cracking of the active material itself causes a decrease in the positive electrode resistance $R_c$. On the other hand, when a new surface is formed on the active material, the formed new surface is eventually altered, and the positive electrode resistance $R_c$ increases. In consideration of the above, the positive electrode resistance $R_c$ can be expressed by a formula (i.e., function of ΔDOD) including the pulverization function f (t, ΔDOD) of formula (9) from the same theory as the negative electrode resistance $R_a$.

Cracking of the positive electrode active material itself also depends on the charge-discharge current value I. As the charge-discharge current value I increases, the current tends to intensively flow through a low resistance portion of the active material, so that the degree of expansion and contraction may vary depending on the portion of the active material. As a result, strain is likely to occur in the active material itself, which causes cracking of the positive electrode active material itself. Therefore, the cracking of the positive electrode active material itself can be expressed by a function of the charge-discharge current value I or a function of the C rate correlated with the charge-discharge current value I.

To summarize the above, the positive electrode resistance $R_c$ can be expressed by the following formula (11) using functions $h_A$ (T, $CCP_c$), $h_B$ (T, $CCP_c$, ΔDOD, I), and $h_C$ (T, $CCP_c$, ΔDOD, I).

Here, the function $h_A$ (T, $CCP_c$) is a function in consideration of the alteration of the surface of the active material. The function $h_B$ (T, $CCP_c$, ΔDOD, I) is a function in consideration of cracking of the altered surface of the active material. The function $h_C$ (T, $CCP_c$, ΔDOD, I) is a function in consideration of cracking of the active material itself.

[Mathematical formula 10]

$$R_c = h_A(T, CCP_c) \times h_B(T, CCP_c, \Delta DOD, I) \times h_C(T, CCP_c, \Delta DOD, I) \quad (11)$$

On the basis of the above theory, the positive electrode resistance $R_c$ is expressed as a function of the battery temperature T of the secondary battery 25, the positive electrode side closed circuit potential $CCP_c$, the change amount ΔDOD, and the charge-discharge current value I.

Here, in step S26, as the negative electrode side closed circuit potential $CCP_a$ and the positive electrode side closed circuit potential $CCP_c$ used for calculating the negative electrode resistance $R_a$ and the positive electrode resistance $R_c$, the negative electrode side closed circuit potential $CCP_a$ and the positive electrode side closed circuit potential $CCP_c$ in the previous execution cycle of the current execution cycle are used. The negative electrode side closed circuit potential $CCP_a$ and the positive electrode side closed circuit potential $CCP_c$ are calculated in step S29 in the immediately preceding execution cycle.

When the negative electrode side closed circuit potential $CCP_a$ and the positive electrode side closed circuit potential $CCP_c$ calculated in the previous execution cycle are not present (e.g., at time of system activation or the like), the initial negative electrode side closed circuit potential $CCP_a$ and the initial positive electrode side closed circuit potential $CCP_c$ are calculated as follows.

First, an initial polarization $\Delta V_a$ of the negative electrode is calculated from the product of the current value I acquired as the battery load history and the initial value of the negative electrode resistance $R_a$, and an initial polarization $\Delta V_c$ of the positive electrode is calculated from the product of the current value I acquired as the battery load history and the initial value of the positive electrode resistance $R_c$. The initial value of the negative electrode resistance $R_a$ and the initial value of the positive electrode resistance $R_c$ are, for example, values of the negative electrode resistance and the positive electrode resistance in an initial state (e.g., state at time of factory shipment) in a secondary battery of the same type as the secondary battery 25 mounted on the vehicle V.

The initial values of the negative electrode resistance and the positive electrode resistance of the secondary battery 25 are stored in, for example, the battery database 54 of the battery control unit 30 of the vehicle V or the management server 50, and can be acquired from the battery control unit 30 or the battery database 54. The negative electrode resistance $R_a$ and the positive electrode resistance $R_c$ in the initial state can be determined by, for example, an AC impedance method, IV measurement, or the like. Alternatively, the negative electrode resistance $R_a$ and the positive electrode resistance $R_c$ in the initial state can also be determined by preparing a half cell using the positive electrode and a half cell using the negative electrode of the disassembled secondary battery 25 in the initial state and measuring the resistance of each half cell.

The open circuit potentials of the negative electrode and the positive electrode of the secondary battery are calculated on the basis of an initial OCP characteristic described later and the SOC calculated in step S24. Each open circuit potential is a potential of each electrode of the secondary battery 25 when a state in which the secondary battery 25 and the external circuit are not energized has elapsed for a long period of time. Hereinafter, the open circuit potential of the negative electrode of the secondary battery 25 is referred to as a negative electrode side open circuit potential $OCP_a$, and the open circuit potential of the positive electrode of the secondary battery 25 is referred to as a positive electrode side open circuit potential $OCP_c$. OCP stands for open circuit potential.

The initial OCP characteristic indicates a relationship between the SOC of the secondary battery 25 and the negative electrode side open circuit potential $OCP_a$ and a relationship between the SOC of the secondary battery 25 and the positive electrode side open circuit potential $OCP_c$ in the initial state, and is stored in, for example, the battery database 54.

Subsequently, the negative electrode side closed circuit potential $CCP_a$ is obtained by adding the negative electrode side open circuit potential $OCP_a$ and the negative electrode side polarization $\Delta V_a$. On the other hand, the positive electrode side closed circuit potential $CCP_c$ can be obtained by adding the positive electrode side open circuit potential $OCP_c$ and the positive electrode side polarization $\Delta V_c$.

When the negative electrode side closed circuit potential $CCP_a$ and the positive electrode side closed circuit potential $CCP_c$ calculated in the previous execution cycle are not present (e.g., at time of system activation or the like), the initial negative electrode side closed circuit potential $CCP_a$ and the initial positive electrode side closed circuit potential $CCP_c$ are calculated by performing the above processing.

When the negative electrode resistance $R_a$ and the positive electrode resistance $R_c$ are calculated according to the above-described theory and the processing proceeds to step S27, the battery diagnostic system 1 calculates the polarization $\Delta V_a$ of the negative electrode and the polarization $\Delta V_c$ of the positive electrode. The polarization $\Delta V_a$ of the negative electrode is calculated by multiplying the current value I of the secondary battery 25 acquired as the battery load history by the negative electrode resistance Ra calculated in step S26. On the other hand, the polarization $\Delta V_c$ of the positive electrode is calculated by multiplying the current value I of the secondary battery 25 by the positive electrode resistance $R_c$ calculated in step S26.

When the processing proceeds to step S28, the battery diagnostic system 1 calculates the negative electrode side open circuit potential $OCP_a$ and the positive electrode side open circuit potential $OCP_c$. The battery diagnostic system 1 calculates the negative electrode side open circuit potential $OCP_a$ and the positive electrode side open circuit potential $OCP_c$ on the basis of the SOC of the secondary battery 25 calculated in step S24 and the updated OCP characteristic of the previous execution cycle stored in the battery database 54. The updated OCP characteristic indicates a relationship between the SOC and the negative electrode side open circuit potential $OCP_a$ and a relationship between the SOC and the positive electrode side open circuit potential $OCP_c$ in the secondary battery 25 after degradation.

Here, the updated OCP characteristic can be acquired as follows. First, the initial OCP characteristic stored in advance in the battery database 54 of the battery diagnostic system 1 is updated on the basis of the negative electrode capacity $Q_a$, the positive electrode capacity $Q_c$, and the positive-negative electrode SOC deviation capacity $Q_{Li}$ calculated in step S30 described later.

The initial OCP characteristic indicates a relationship between the SOC and the negative electrode side open circuit potential $OCP_a$ and a relationship between the SOC and the positive electrode side open circuit potential $OCP_c$ in the secondary battery 25 in the initial state. The method of updating the initial OCP characteristic is not particularly limited, and, for example, a known method can be adopted.

In step S29, the battery diagnostic system 1 calculates a negative electrode side closed circuit potential $CCP_a$ and a positive electrode side closed circuit potential $CCP_c$ of the secondary battery 25. First, the battery diagnostic system 1 acquires the polarization $\Delta V_a$ and the polarization $\Delta V_c$ calculated in step S27, and acquires the negative electrode side open circuit potential $OCP_a$ and the positive electrode side open circuit potential $OCP_c$ calculated in step S28.

The negative electrode side closed circuit potential $CCP_a$ is calculated by adding the negative electrode side open circuit potential $OCP_a$ and the polarization $\Delta V_a$ of the negative electrode, and the negative electrode side open circuit potential $OCP_a$ can be rewritten to the negative electrode side closed circuit potential $CCP_a$. Similarly, the positive electrode side closed circuit potential $CCP_c$ is calculated by adding the positive electrode side open circuit potential $OCP_c$ and the polarization $\Delta V_c$ of the positive electrode, and the positive electrode side open circuit potential $OCP_c$ can be rewritten to the positive electrode side closed circuit potential $CCP_c$.

Here, polarization of the secondary battery 25 becomes apparent due to degradation. That is, due to the occurrence of polarization, the closed circuit voltage of the secondary battery 25 increases during charging of the secondary battery 25, and the closed circuit voltage decreases during discharging. As the degradation of the secondary battery 25 progresses, the closed circuit voltage further increases during charging of the secondary battery 25, and the closed circuit voltage further decreases during discharging.

Figure 7:
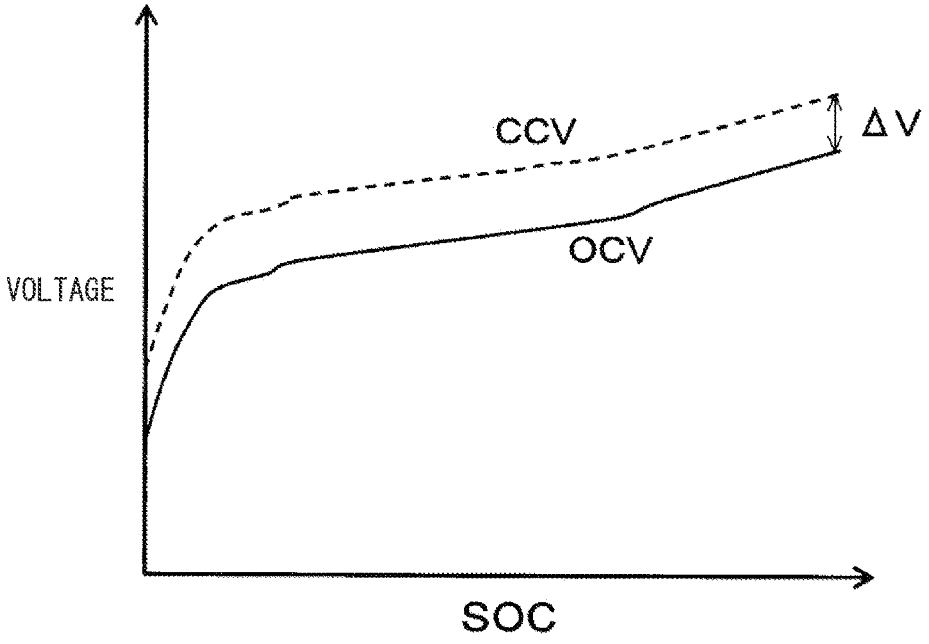
FIG. 7 is an explanatory diagram schematically illustrating a relationship between an open circuit voltage and a closed circuit voltage of a secondary battery before degradation and the SOC.
Figure 8:
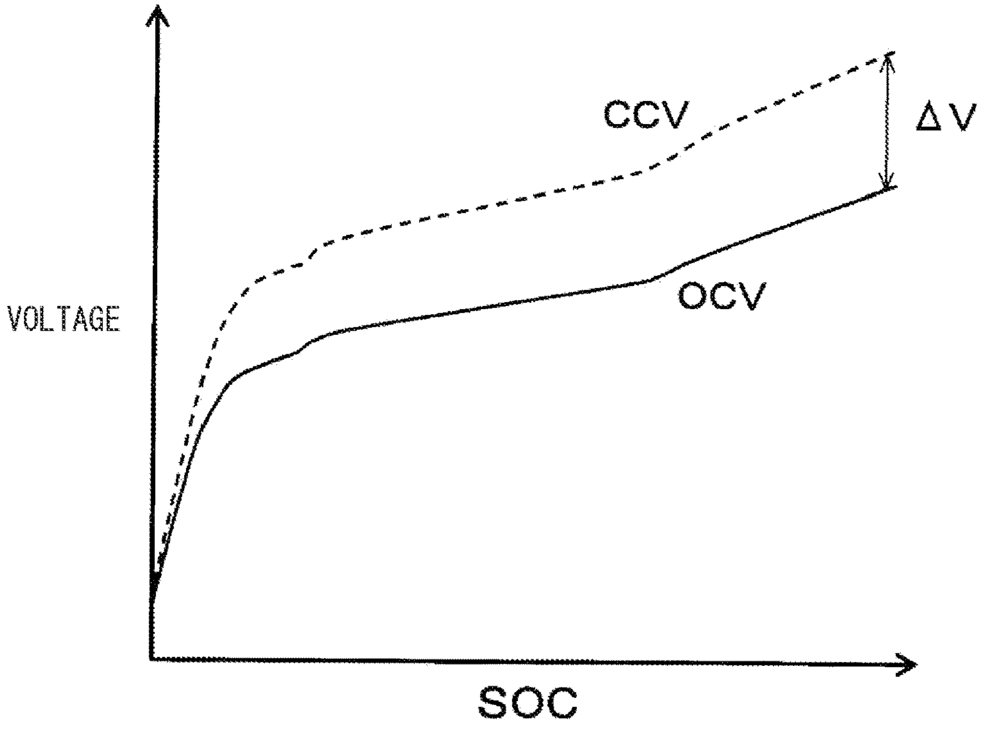
FIG. 8 is an explanatory diagram schematically illustrating a relationship between an open circuit voltage and a closed circuit voltage of a secondary battery after degradation and the SOC.

This point will be described with reference to FIGS. 7 and 8. FIG. 7 schematically illustrates the relationship between the SOC and the voltage during charging with respect to the secondary battery 25 before degradation, and FIG. 8 schematically illustrates the relationship between the SOC and the voltage during charging with respect to the secondary battery 25 after degradation. In FIGS. 7 and 8, the open circuit voltage is represented by a solid line, the closed circuit voltage is represented by a broken line, and the scales of the voltages on the vertical axis coincide with each other.

Hereinafter, the open circuit voltage is referred to as OCV, and the closed circuit voltage is referred to as CCV. OCV stands for open circuit voltage, and CCV stands for closed circuit voltage.

Referring to FIGS. 7 and 8, it can be seen that the polarization ΔV of the secondary battery 25 after degradation is larger than the polarization ΔV before degradation. In view of the above, in estimating the degradation amount of the secondary battery 25, the battery diagnostic system 1 rewrites the open circuit potential OCP to the closed circuit potential CCP in consideration of the polarization ΔV, and predicts the battery capacity QB using the closed circuit potential CCP.

In step S30, the battery diagnostic system 1 calculates the negative electrode capacity $Q_a$, the positive electrode capacity $Q_c$, and the positive-negative electrode SOC deviation capacity $Q_{Li}$ of the secondary battery 25. First, the battery diagnostic system 1 acquires the negative electrode side closed circuit potential $CCP_a$ and the positive electrode side closed circuit potential $CCP_c$ calculated in step S29, the battery temperature T of the secondary battery 25 acquired as the battery load history, and the change amount ΔDOD calculated in step S25.

Next, the battery diagnostic system 1 calculates each of the negative electrode capacity $Q_a$, the positive electrode capacity $Q_c$, and the positive-negative electrode SOC deviation capacity $Q_{Li}$ of the secondary battery 25 on the basis of at least one of the negative electrode side closed circuit potential $CCP_a$ and the positive electrode side closed circuit potential $CCP_c$, the battery temperature T, the current value I, and the change amount ΔDOD.

First, calculation of the negative electrode capacity $Q_a$ will be described. The battery diagnostic system 1 expresses the negative electrode capacity $Q_a$ with the same theory as the case of calculating the negative electrode resistance $R_a$. That is, the negative electrode capacity $Q_a$ is expressed by the following formula (12) using a function $i_A$ (T, $CCP_a$), a function $i_B$ (T, $CCP_a$, ΔDOD, I), and a function $i_C$ (T, $CCP_a$, ΔDOD, I).

Here, the function $i_A$ (T, $CCP_a$) is a function considering that a film is formed on the surface of the active material. The function $i_B$ (T, $CCP_a$, ΔDOD, I) is a function in consideration of cracking of the film formed on the surface of the active material. The function $i_C$ (T, $CCP_a$, ΔDOD, I) is a function in consideration of cracking of the active material itself. That is, the negative electrode capacity $Q_a$ is expressed as a function of the battery temperature T of the secondary battery 25, the negative electrode side closed circuit potential $CCP_a$, the change amount ΔDOD (i.e., pulverization function f (t, ΔDOD)), and the charge-discharge current value I.

[Mathematical formula 11]

$$Q_a = i_A(T, CCP_a) \times i_B(T, CCP_a, \Delta DOD, I) \times i_C(T, CCP_a, \Delta DOD, I) \quad (12)$$

Next, calculation of the positive electrode capacity $Q_c$ will be described. The battery diagnostic system 1 expresses the positive electrode capacity $Q_c$ with the same theory as the case of calculating the positive electrode resistance $R_c$. That is, the positive electrode capacity $Q_c$ is expressed by the following formula (13) using a function $j_A$ (T, $CCP_c$), a function $j_B$ (T, $CCP_c$, ΔDOD, I), and a function $j_C$ (T, $CCP_c$, ΔDOD, I).

Here, the function $j_A$ (T, $CCP_c$) is a function in consideration of the alteration of the surface of the active material. The function $j_B$ (T, $CCP_c$, ΔDOD, I) is a function in consideration of cracking of the altered surface of the active material. The function $j_C$ (T, $CCP_c$, ΔDOD, I) is a function in consideration of cracking of the active material itself. That is, the positive electrode capacity $Q_c$ is expressed as a function of the battery temperature T, the positive electrode side closed circuit potential $CCP_c$, the change amount ΔDOD (i.e., pulverization function f (t, ΔDOD)), and the charge-discharge current value I.

[Mathematical formula 12]

$$Q_c = j_A(T, CCP_c) \times j_B(T, CCP_c, \Delta DOD, I) \times j_C(T, CCP_c, \Delta DOD, I) \quad (13)$$

Subsequently, calculation of the positive-negative electrode SOC deviation capacity $Q_{Li}$ will be described. The positive-negative electrode SOC deviation capacity $Q_{Li}$ correlates with consumption of lithium ions due to formation of a film (solid electrolyte interface (SEI)) in the negative electrode and the positive electrode. Since the consumption of lithium ions due to the formation of the film is a chemical reaction, the positive-negative electrode SOC deviation capacity $Q_{Li}$ follows the Arrhenius law. Therefore, the positive-negative electrode SOC deviation capacity $Q_{Li}$ can be expressed by a function of the battery temperature T.

The consumption of lithium ions due to film formation in the negative electrode and the positive electrode follows the Tafel's law since it is an oxidation-reduction reaction. Therefore, the positive-negative electrode SOC deviation capacity $Q_{Li}$ can be expressed by a function of the negative electrode side closed circuit potential $CCP_a$ and the positive electrode side closed circuit potential $CCP_c$.

In addition, expansion and contraction of the active material of each electrode (i.e., positive electrode and negative electrode) are repeated by repetition of the charge-discharge cycle of the secondary battery 25, and cracking of the surface film of the active material in each electrode progresses. As a result, each electrode surface is eventually exposed from the crack of the film, and a new film is formed on the exposed surface, thereby increasing the consumption amount of lithium ions. In addition, the larger the change amount ΔDOD, the larger the degree of expansion and contraction of the active material. Therefore, the positive-negative electrode SOC deviation capacity $Q_{Li}$ can be expressed by a function of the change amount ΔDOD.

In each electrode, as described above, the active material itself cracks and the diameter thereof decreases due to repeated expansion and contraction of the active material. Cracking of the active material itself includes both an element for increasing the positive-negative electrode SOC deviation capacity $Q_{Li}$ and an element for decreasing the positive-negative electrode SOC deviation capacity $Q_{Li}$.

First, since a new surface (i.e., surface on which film is not formed) is formed on the active material due to cracking of the active material itself, lithium ions are more likely to move to the active material of each electrode, which causes an increase in positive-negative electrode SOC deviation capacity $Q_{Li}$. On the other hand, when a new surface is formed on the active material, film formation is promoted on the new surface to consume lithium ions, which causes a decrease in positive-negative electrode SOC deviation capacity $Q_{Li}$.

In consideration of the above, the positive-negative electrode SOC deviation capacity $Q_{Li}$ can be expressed by a formula (i.e., function of change amount ΔDOD) including the pulverization function f (t, ΔDOD) from the same theory as the negative electrode resistance $R_a$ and the positive electrode resistance $R_c$.

Cracking of the active material itself in each electrode also depends on the charge-discharge current value I. As the charge-discharge current value I increases, the current tends to intensively flow through a low resistance portion of the active material, so that the degree of expansion and contraction may vary depending on the portion of the active material. As a result, strain is likely to occur in the active material, which causes cracking of the active material itself. Therefore, the cracking of the active material itself of each electrode can be expressed by a function of the charge-discharge current value I or a function of the C rate correlated with the charge-discharge current value I.

As described above, the positive-negative electrode SOC deviation capacity $Q_{Li}$ is expressed by the following formula (14) using the function $k_A$ (T, $CCP_a$), the function $k_B$ (T, $CCP_a$, ΔDOD, I), $k_C$ (T, $CCP_a$, ΔDOD, I), the function $I_A$ (T, $CCP_c$), the function $I_B$ (T, $CCP_c$, ΔDOD, I), and the function $I_C$ (T, $CCP_c$, ΔDOD, I).

Here, the function $k_A$ (T, $CCP_a$) is a function considering that a film is formed on the surface of the active material of the negative electrode. The function $k_B$ (T, $CCP_a$, ΔDOD, I) is a function in consideration of cracking of the film formed on the surface of the active material of the negative electrode. The function $k_C$ (T, $CCP_a$, ΔDOD, I) is a function in consideration of cracking of the active material itself of the negative electrode.

Further, the function $I_A$ (T, $CCP_c$) is a function considering that a film is formed on the surface of the active material of the positive electrode. The function $I_B$ (T, $CCP_c$, ΔDOD, I) is a function in consideration of cracking of the film formed on the surface of the active material of the positive electrode. The function $I_C$ (T, $CCP_c$, ΔDOD, I) is a function in consideration of cracking of the active material itself of the positive electrode.

[Mathematical formula 13]

$$Q_{Li} = k_A(T, CCP_a)\times k_B(T, CCP_a, \Delta DOD, I)\times k_C(T, CCP_a, \Delta DOD, I) + l_A(T, CCP_c)\times l_B(T, CCP_c, \Delta DOD, I)\times l_C(T, CCP_c, \Delta DOD, I) \quad (14)$$

As described above, the positive-negative electrode SOC deviation capacity $Q_{Li}$ can be expressed as a function of the battery temperature T, the negative electrode side closed circuit potential $CCP_a$, the positive electrode side closed circuit potential $CCP_c$, the change amount ΔDOD, and the charge-discharge current value I.

In step S31, the battery diagnostic system 1 obtains the battery capacity $Q_B$ using the negative electrode capacity $Q_a$, the positive electrode capacity $Q_c$, and the positive-negative electrode SOC deviation capacity $Q_{Li}$ calculated in step S30. Specifically, the battery diagnostic system 1 determines the smallest one of the negative electrode capacity $Q_a$, the positive electrode capacity $Q_c$, and the positive-negative electrode SOC deviation capacity $Q_{Li}$ of the secondary battery 25 as the battery capacity $Q_B$ of the secondary battery 25. That is, the battery diagnostic system 1 executes $Q_B$=min ($Q_a$, $Q_c$, $Q_{Li}$).

As described above, the negative electrode capacity $Q_a$ corresponds to the number of sites of the negative electrode into which lithium ions can be inserted, and the positive electrode capacity $Q_c$ corresponds to the number of sites of the positive electrode into which lithium ions can be inserted. The positive-negative electrode SOC deviation capacity $Q_{Li}$ corresponds to the number of lithium ions that can move between the positive electrode and the negative electrode and ease of movement of all lithium ions. Therefore, the smallest one of the negative electrode capacity $Q_a$, the positive electrode capacity $Q_c$, and the positive-negative electrode SOC deviation capacity $Q_{Li}$ corresponds to the battery capacity $Q_B$ of the secondary battery 25.

In step S31, the battery diagnostic system 1 obtains a battery resistance RB, which is the resistance value of the entire secondary battery 25, using the negative electrode resistance $R_a$ and the positive electrode resistance $R_c$. Specifically, the battery diagnostic system 1 determines the sum of the components (negative electrode resistance $R_a$ and positive electrode resistance $R_c$) forming the secondary battery 25 as the resistance value of the entire secondary battery 25. That is, the battery diagnostic system 1 executes $R_B$=$R_a$+$R_c$.

As described above, each of the negative electrode resistance $R_a$, the positive electrode resistance $R_c$, the negative electrode capacity $Q_a$, the positive electrode capacity $Q_c$, the positive-negative electrode SOC deviation capacity $Q_{Li}$, the battery capacity $Q_B$, and the battery resistance $R_B$ of the secondary battery 25 at the present time is calculated. The battery diagnostic system 1 calculates the element degradation states $SOHQ_a$e, $SOHQ_c$e, $SOHQ_{Li}$e, $SOHR_a$e, and $SOHR_c$e using the calculated positive electrode capacity $Q_c$ and the like.

For example, the element degradation state $SOHQ_a$e is calculated by obtaining the ratio of the negative electrode capacity $Q_a$ of the secondary battery 25 at the present time to the negative electrode capacity $Q_a$ of the initial secondary battery 25. The element degradation state $SOHQ_c$e is calculated by obtaining the ratio of the positive electrode capacity $Q_c$ of the secondary battery 25 at the present time to the positive electrode capacity $Q_c$ of the initial secondary battery 25. The element degradation state $SOHQ_{Li}$e is calculated by obtaining the ratio of the positive-negative electrode SOC deviation capacity $Q_{Li}$ of the secondary battery 25 at the present time to the positive-negative electrode SOC deviation capacity $Q_{Li}$ in the initial secondary battery 25.

The element degradation state $SOHR_a$e is calculated by obtaining the ratio of the negative electrode resistance $R_a$ of the secondary battery 25 at the present time to the negative electrode resistance $R_a$ in the secondary battery 25 in the initial state. The element degradation state $SOHR_c$e is calculated by obtaining the ratio of the positive electrode resistance $R_c$ of the secondary battery 25 at the present time to the positive electrode resistance $R_c$ of the secondary battery 25 in the initial state.

The battery state $SOHQ_B$e of the entire secondary battery 25 can be obtained as the minimum value of the element degradation states $SOHQ_a$e, $SOHQ_c$e, and $SOHQ_{Li}$e. In addition, the battery state $SOHR_B$e indicates a degradation state related to the resistance of the entire secondary battery 25, and can be obtained by $SOHR_B$e=$SOHR_a$e+$SOHR_c$e.

In the calculation processing of steps S26 to S31, the constants included in the formulae and the coefficients and constants of the functions forming each formula are determined with reference to the battery characteristic information stored in the battery database 54.

In this case, after completion of the calculation processing of the battery state in step S31, the battery diagnostic system 1 compares the calculated degradation state identified by the battery state of the secondary battery 25 with the degradation state actually occurring in the secondary battery 25, and updates the battery characteristic information of the battery database 54.

Specifically, the battery diagnostic system 1 updates the battery characteristic information of the battery database 54 such that the state expressed by the battery states $SOHQ_B$e and $SOHR_B$e matches the state of degradation actually occurring in the secondary battery 25.

In this way, by calculating the degradation state of each component of the secondary battery 25 in consideration of a plurality of causes of degradation of each component, it is possible to predict the degradation state of each component of the secondary battery 25 with high accuracy.

This point will be described with reference to FIG. 9 using a specific example. As a specific example, simulation results on the influence of the difference in causes of degradation on the future progress of degradation will be given using two secondary batteries 25 of the same type (hereinafter referred to as first battery and second battery for convenience).

The first battery and the second battery are secondary batteries of the same type. In the graph illustrated FIG. 9, the horizontal axis represents the square root of the number of days, and the vertical axis represents the capacity retention rate of the secondary battery 25. The capacity retention rate of the secondary battery 25 at a predetermined time is a ratio of the capacity of the secondary battery 25 at the predetermined time to the capacity of the secondary battery 25 in the initial state.

Figure 9:
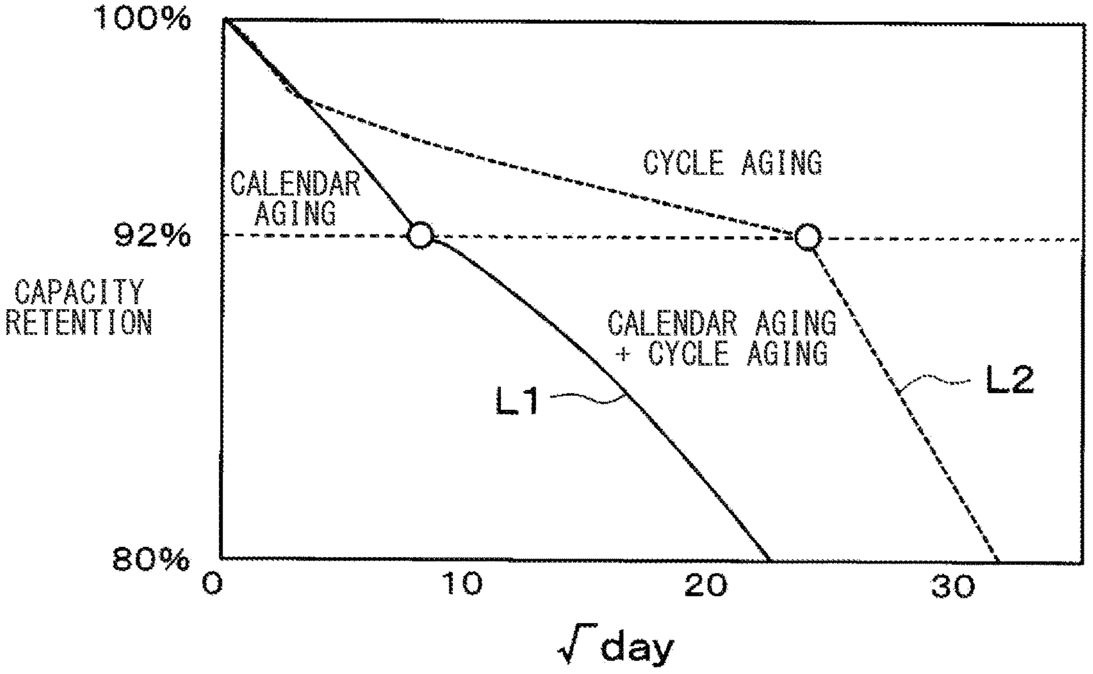
FIG. 9 is an explanatory diagram related to an influence of a degradation mode on future progress of degradation.

In FIG. 9, an experimental result on the first battery is indicated by line L1, and an experimental result on the second battery is indicated by line L2. In each of the results of the first battery and the second battery illustrated in FIG. 9, the positive-negative electrode SOC deviation capacity $Q_{Li}$ is the smallest among the negative electrode capacity $Q_a$, the positive electrode capacity $Q_c$, and the positive-negative electrode SOC deviation capacity $Q_{Li}$. Therefore, in the experimental results of the first battery and the second battery, the battery capacity $Q_B$=positive-negative electrode SOC deviation capacity $Q_{Li}$.

The secondary battery 25 through which a large current flows for driving an automobile or the like is often used only in a region where the positive-negative electrode SOC deviation capacity $Q_{Li}$ is the smallest among the negative electrode capacity $Q_a$, the positive electrode capacity $Q_c$, and the positive-negative electrode SOC deviation capacity $Q_{Li}$ of the secondary battery 25. That is, in the secondary battery 25 through which a large current flows, the battery capacity $Q_B$ is often the positive-negative electrode SOC deviation capacity $Q_{Li}$.

In the specific example illustrated in FIG. 9, for the first battery, the first battery was exposed to calendar aging under an environment of 45° C. from a state where the capacity retention rate was 100%, and the capacity retention rate was reduced to 92%. The decrease in capacity of the first battery at this time was 7.2% due to film formation on each electrode, 0.4% due to cracking of the film formed on the surface of the active material of each electrode, and 0.4% due to cracking of the active material itself of each electrode.

On the other hand, in the specific example illustrated in FIG. 9, for the second battery, the second battery was exposed to cycle aging under an environment of 45° C. from a state where the capacity retention rate was 100%, and the capacity retention rate was reduced to 92%. The decrease in capacity of the second battery at this time was 4.0% due to film formation on each electrode, 1.6% due to cracking of the film formed on the surface of the active material of each electrode, and 2.4% due to cracking of the active material itself of each electrode.

That is, even in the first battery and the second battery having the same capacity retention rate and positive-negative electrode SOC deviation capacity $Q_{Li}$, it can be seen that the values of the functions forming formula (14) related to the positive-negative electrode SOC deviation capacity $Q_{Li}$ are different between the first battery and the second battery depending on the previous use situation.

The first battery and the second battery having a capacity retention rate of 92% were aged under the same conditions by combining cycle aging and calendar aging. As illustrated in FIG. 9, in the region where the capacity retention rate is 92% or less, the inclination of line L2 indicating the degradation state of the second battery is larger than the inclination of line L1 indicating the degradation state of the first battery. That is, under this condition, it can be seen that the second battery that was exposed to cycle aging first aged faster than the first battery that was exposed to calendar aging first.

As a result, it can be seen that even in the secondary batteries 25 having the same capacity retention rate, the degree of progress of the subsequent degradation of the secondary batteries 25 varies depending on the previous use situation of the secondary batteries 25. In addition, the positive-negative electrode SOC deviation capacity $Q_{Li}$ is calculated on the basis of a function in consideration of film formation on each electrode, a function in consideration of cracking of the film formed on the surface of the active material of each electrode, and a function in consideration of cracking of the active material itself of each electrode, whereby the battery capacity $Q_B$ with high accuracy can be calculated. The same applies to the case where the battery capacity $Q_B$ is the negative electrode capacity $Q_a$ or the positive electrode capacity $Q_c$.

Each of the negative electrode resistance $R_a$ and the positive electrode resistance $R_c$ is also calculated in consideration of a plurality of causes of degradation. Therefore, the negative electrode resistance $R_a$ and the positive electrode resistance $R_c$ can also be calculated with high accuracy from the same logic as the logic in which the battery capacity $Q_B$ is calculated with high accuracy.

Referring back to FIG. 4, processing after step S4 will be described. In step S4, plural causes of degradation causing the secondary battery 25 to enter the battery state calculated in step S3 are extracted. Here, the difference between the state of the secondary battery 25 in the initial state and the state of the secondary battery 25 at the present time is referred to as a total degradation amount Z.

The total degradation amount Z includes a calendar degradation amount Za caused by calendar aging, a cycle degradation amount Zb caused by cycle aging, and a degradation amount Zc caused by other causes of degradation. Therefore, the total degradation amount Z is expressed by the following formula (15).

[Mathematical formula 14]

$$Z = Za + Zb + Zc \tag{15}$$

The calendar degradation amount Za is a degradation amount of the secondary battery 25 caused by calendar aging. Calendar aging progresses with the lapse of time regardless of energization to the secondary battery 25, and shows a tendency to further progress by increasing the battery temperature T of the secondary battery 25. In addition, it is considered that calendar aging progresses by forming a film on the surface of the active material.

As described above, since the film is generated by a chemical reaction such as oxidation-reduction decomposition of the electrolytic solution of the secondary battery 25 or the additive thereof, and thus is formed according to the Arrhenius law, the calendar degradation amount Za can be expressed by a function of the battery temperature T. Additionally, since the film formation is caused by oxidation-reduction, the film formation follows the Tafel's law. Therefore, the calendar degradation amount Za can be expressed by a function of the closed circuit potential CCP. As described above, the calendar degradation amount Za can be obtained by a formula (16) using a function in consideration of the formation of the film in formulae (12) to (14) described above.

[Mathematical formula 15]

$$Za = f(i_A(T, CCP_a), j_A(T, CCP_c), k_A(T, CCP_a), l_A(T, CCP_c)) \tag{16}$$

The cycle degradation amount Zb is a degradation amount of the secondary battery 25 caused by cycle aging. Cycle aging progresses by energization of the secondary battery 25, and tends to further progress by energization in a state where the battery temperature of the secondary battery 25 is low. In addition, it is considered that cycle aging is caused by expansion and contraction of each electrode and the like, and progresses by cracking of the film formed on the surface of the active material.

As described above, the cracking of the surface film progresses as the expansion and contraction of the active material are repeated as the charge-discharge cycle of the secondary battery 25 is repeated. As a result, a new film is formed on the surface exposed from the crack of the film, so that the film amount increases, and thus the degradation further progresses. The larger the change amount ΔDOD, the larger the degree of expansion and contraction of the active material. Therefore, the cycle degradation amount Zb can be expressed by a function of the change amount ΔDOD. As described above, the cycle degradation amount Zb can be obtained by a formula (17) using a function in consideration of cracking of the film formed on the surface of the active material in formulae (12) to (14) described above.

[Mathematical formula 16]

$$Zb = f(i_B(T, CCP_a, \Delta DOD, I), j_B(T, CCP_c, \Delta DOD, I), k_B(T, CCP_a, \Delta DOD, I), l_B(T, CCP_c, \Delta DOD, I)) \quad (17)$$

As described above, the calendar degradation amount Za and the cycle degradation amount Zb in the total degradation amount Z of the secondary battery 25 at the present time can be obtained from formulae (16) and (17). As a result, with respect to the degradation of the secondary battery 25 at the present time, it is possible to evaluate which one of the calendar aging caused by the formation of the film on the surface of the active material and the cycle aging caused by cracking of the film formed on the surface of the active material strongly affects the degradation.

In step S5, the battery diagnostic system 1 sets a handling criteria. A handling criteria is a condition serving as a guideline regarding a content proposed together with a diagnosis result of the secondary battery 25 using a predicted battery state or the like, and also includes a period condition of a future use schedule of the secondary battery 25 (such as year when use of secondary battery 25 ends).

In the first embodiment, a handling criteria related to maintenance is input from the information terminal 10 of the user U. The handling criteria of the first embodiment includes a cost condition related to the cost required for maintenance, a period condition related to a period required for completion of maintenance, and the like.

In step S6, the battery diagnostic system 1 acquires a predicted battery load that is considered to act on the secondary battery 25 when used in the future, and sets the predicted battery load as a condition for calculating the predicted battery state.

In the first embodiment, the predicted battery load includes a predicted battery load generated by dividing the magnitude of the predicted battery load into a plurality of stages, and a predicted battery load according to a user characteristic learned from the battery load history acquired in step S1. These predicted battery loads are generated according to the selection of the user U using the information terminal 10, and are used for calculation of the predicted battery state and the like.

As illustrated in FIG. 10, in the battery diagnostic system 1 according to the first embodiment, plural types of predicted battery loads such as "predicted battery load (1)", "predicted battery load (2)", "predicted battery load (3)", and "predicted battery load (4)" are generated. Each predicted battery load also includes matters related to charging of the secondary battery 25, and also includes types which are general normal charging and rapid charging in which charging is completed in a shorter time using a larger power than normal charging.

"Predicted battery load (1)" is a predicted battery load generated so that the travel distance of the vehicle V per day is 450 km/d. That is, the predicted battery load (1) corresponds to an example of the predicted battery load in a case where "large" is selected by the user U as the magnitude of the predicted battery load in step S6.

"Predicted battery load (2" is a predicted battery load generated so that the travel distance of the vehicle V per day is 150 km/d. That is, the predicted battery load (2) corresponds to an example of the predicted battery load in a case where "medium" is selected by the user U as the magnitude of the predicted battery load in step S6.

"Predicted battery load (3)" is a predicted battery load generated so that the travel distance of the vehicle V per day is 100 km/d. That is, the predicted battery load (3) corresponds to an example of the predicted battery load in a case where "large" is selected by the user U as the magnitude of the predicted battery load in step S6.

"Predicted battery load (4)" is a predicted battery load generated according to a learning result of the battery load history. As illustrated in FIG. 10, the predicted battery load (4) has some of the characteristics of the predicted battery load (2) and some of the characteristics of the predicted battery load (3), and is generated on the basis of the accumulated learning result of the battery load history. Therefore, the predicted battery load (4) corresponds to an example of the predicted battery load in a case where "learning" is selected by the user U as the predicted battery load in step S6.

The predicted battery load only needs to have a correlation with the magnitude of the load acting on the secondary battery 25 when the secondary battery 25 is used in the future, and, for example, may include the use frequency, the charge-discharge current value, the battery temperature, and the like of the secondary battery 25. When the use characteristics (e.g., operation and operation frequency of accelerator pedal and brake pedal) of the user U affect the load acting on the secondary battery 25 as in the driving of the vehicle V, the use characteristics of the user U may be included in the information forming the predicted battery load.

In step S7, the battery diagnostic system 1 calculates each of predicted element degradation states $SOHQ_a p$, $SOHQ_c p$, $SOHQ_{Li} p$, $SOHR_a p$, and $SOHR_c p$ that will occur in the future when the secondary battery 25 is used according to the predicted battery load set in step S6.

That is, the battery diagnostic system 1 calculates the predicted element degradation states $SOHQ_a p$ and $SOHR_a p$ of the negative electrode on the basis of a plurality of causes of degradation of the negative electrode of the secondary battery 25. The battery diagnostic system 1 calculates the predicted element degradation states $SOHQ_c p$ and $SOHR_c p$ of the positive electrode on the basis of a plurality of causes of degradation of the positive electrode in the secondary battery 25. In addition, the battery diagnostic system 1 calculates the predicted element degradation state $SOHQ_{Li} p$ of the electrolyte on the basis of a plurality of causes of degradation of the electrolyte in the secondary battery 25. The cause of degradation of each battery component is the same as the cause of degradation of each battery component in steps S2 to S4 described above.

Subsequently, the battery diagnostic system 1 calculates predicted battery states $SOHQ_B p$ and $SOHR_B p$, which are degradation states of the entire secondary battery 25 that will occur in the future when the secondary battery 25 is used according to the predicted battery load.

The predicted battery state $SOHQ_B p$ is calculated by taking the minimum value of the predicted element degradation states $SOHQ_a p$, $SOHQ_c p$, and $SOHQ_{Li} p$, and indicates a future degradation state of the secondary battery 25 related to capacity. That is, $SOHQ_Bp=\min(SOHQ_ap, SOHQ_cp, SOHQ_{Li}p)$.

The predicted battery state $SOHR_Bp$ is calculated by the sum of the predicted element degradation states $SOHR_ap$ and $SOHR_cp$, and indicates a future degradation state of the secondary battery 25 related to resistance. That is, $SOHR_Bp=SOHR_ap+SOHR_cp$. In addition, the predicted calendar degradation amount and the predicted cycle degradation amount can be calculated using the same theory as that at the time of calculating the battery state.

In step S8, the battery diagnostic system 1 ranks the secondary battery 25 after use according to the predicted battery load using the calculated predicted battery states $SOHQ_Bp$ and $SOHR_Bp$. The secondary battery 25 is basically ranked on the basis of a map configured by associating a capacity rank related to the capacity of the secondary battery 25 with a resistance rank related to the resistance of the secondary battery 25.

The capacity rank of the secondary battery 25 is determined on the basis of the capacity of the secondary battery 25 required in the use mode according to the predicted battery load, the battery state $SOHQ_Be$ calculated in step S3, and the predicted battery state $SOHQ_Bp$ calculated in step S7.

In the case of the first embodiment, first, in identifying the capacity rank, the battery diagnostic system 1 calculates the life time. Specifically, the battery diagnostic system 1 calculates the relationship between the number of days of use of the secondary battery 25 up to the present time and the battery state $SOHQ_Be$. Next, the battery diagnostic system 1 calculates the relationship between the number of days of use when the secondary battery 25 is used in the future in the use mode related to the predicted battery load and the predicted battery state $SOHQ_Bp$ until the required capacity retention rate indicating the capacity of the secondary battery 25 required in the use mode according to the predicted battery load is reached. The life time is a time from when use according to the predicted battery load is started until the capacity retention rate of the secondary battery 25 reaches the required capacity retention rate.

Similarly, in identifying the capacity rank, the battery diagnostic system 1 calculates the life travel distance. The battery diagnostic system 1 calculates the relationship between a travel distance traveled by the vehicle V equipped with the secondary battery 25 up to the present time and the battery state $SOHQ_Be$. Next, the battery diagnostic system 1 calculates the relationship between the travel distance when the vehicle V equipped with the secondary battery 25 in the use mode related to the predicted battery load travels in the future and the predicted battery state $SOHQ_Bp$ until the value of the predicted battery state $SOHQ_Bp$ reaches the required capacity retention rate. The life travel distance means a travel distance from the start of use according to the predicted battery load when the predicted battery state $SOHQ_Bp$ of the secondary battery 25 reaches the required capacity retention rate.

The battery diagnostic system 1 determines the capacity rank by using a map in which the relationship among the life time, the life travel distance, and the capacity rank is calculated in advance. For example, in the battery diagnostic system 1, the longer the life time and the longer the life travel time, the higher the capacity rank. In the first embodiment, the capacity rank is ranked using characters A to H, and it is assumed that the capacity rank A has the highest rank, and the ranks decrease in the alphabetical order.

The resistance rank of the secondary battery 25 is determined on the basis of the capability of the secondary battery 25 required in the use mode according to the predicted battery load, the battery state $SOHR_Be$ calculated in step S3, and the predicted battery state $SOHR_Bp$ calculated in step S7.

In the case of the first embodiment, first, in identifying the resistance rank, the battery diagnostic system 1 calculates the number of requested days required in the use mode related to the predicted battery load. Specifically, the battery diagnostic system 1 calculates the relationship between the number of days of use of the secondary battery 25 up to the present time and the battery state $SOHR_Be$.

Next, the battery diagnostic system 1 calculates the relationship between the number of days of use when the secondary battery 25 is used in the future in the use mode related to the predicted battery load and the predicted battery state $SOHR_Bp$ until the required resistance increase rate indicating the capacity of the secondary battery 25 required in the use mode according to the predicted battery load is reached. The life time related to the resistance rank is a time from when use according to the predicted battery load is started until the resistance increase rate of the secondary battery 25 reaches the required resistance increase rate.

Similarly, in identifying the resistance rank, the battery diagnostic system 1 calculates the life travel distance. The battery diagnostic system 1 calculates the relationship between a travel distance traveled by the vehicle V equipped with the secondary battery 25 up to the present time and the battery state $SOHR_Be$.

Next, the battery diagnostic system 1 calculates the relationship between the travel distance when the vehicle V equipped with the secondary battery 25 in the use mode related to the predicted battery load travels in the future and the predicted battery state $SOHR_Bp$ until the value of the predicted battery state $SOHR_Bp$ reaches the required resistance increase rate. The life travel distance related to the resistance rank means a travel distance from the start of use according to the predicted battery load when the predicted battery state $SOHR_Bp$ of the secondary battery 25 reaches the required resistance increase rate.

The battery diagnostic system 1 determines the resistance rank by using a map in which the relationship between the life time and the life travel distance calculated for the resistance rank and the resistance rank is calculated in advance. For example, in the battery diagnostic system 1, the longer the life time and the longer the life travel time, the higher the resistance rank. In the first embodiment, the resistance rank is ranked using characters A to H, and it is assumed that the resistance rank A has the highest rank, and the ranks decrease in the alphabetical order.

Figure 11:
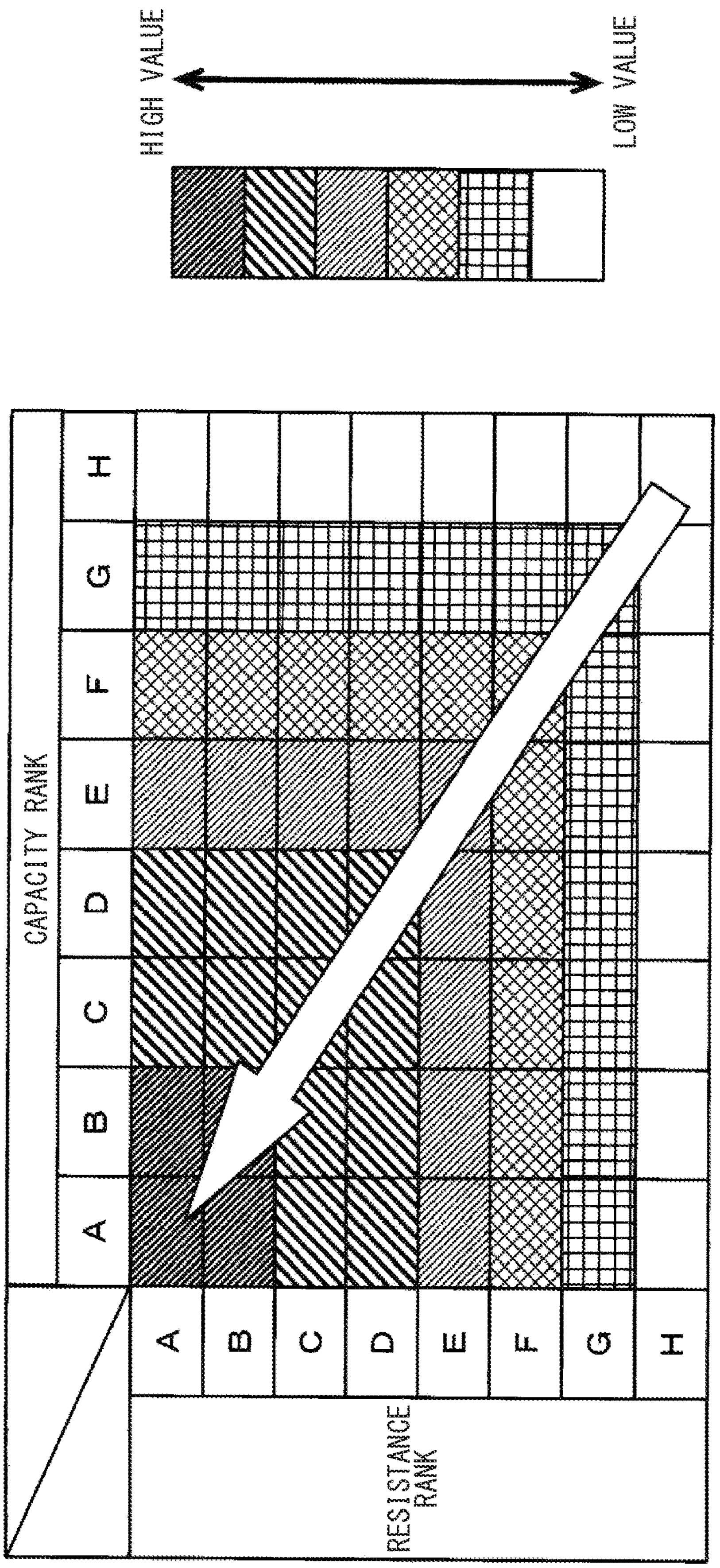
FIG. 11 is an explanatory diagram illustrating a relationship between ranking and the remaining value of secondary batteries.

Thereafter, the battery diagnostic system 1 ranks the remaining value of the secondary battery 25 when the secondary battery 25 is used in the use mode related to the predicted battery load using the determined capacity rank and resistance rank. As illustrated in FIG. 11, as the capacity rank is higher and the resistance rank is higher, the secondary battery 25 is ranked as having a higher remaining value.

At this time, in order to evaluate the level of the remaining value of the secondary battery 25 in the same rank band, evaluation based on predicted causes of degradation (predicted calendar degradation amount and predicted cycle degradation amount) may be performed. The battery diagnostic system 1 evaluates the ratio between the predicted calendar degradation amount and the predicted cycle degradation amount on the basis of a standard based on the required capacity in the use mode related to the predicted battery load, and evaluates the remaining value in the same rank band.

In step S9, the battery diagnostic system 1 calculates the remaining value of the secondary battery 25 using the information such as the battery states $SOHQ_Be$, $SOHR_Be$, the predicted battery states $SOHQ_Bp$, $SOHR_Bp$, and the rank of the secondary battery 25 and the map stored in the storage device 53.

The element degradation states $SOHQ_ae$, $SOHQ_ce$, $SOHQ_{Li}e$, $SOHR_ae$, $SOHR_Be$, the calendar degradation amount Za, and the cycle degradation amount Zb may be used as the information used for evaluation of the remaining value. In addition, the remaining value can be evaluated using the predicted element degradation states $SOHQ_ap$, $SOHQ_cp$, $SOHQ_{Li}p$, $SOHR_ap$, $SOHR_cp$, the predicted calendar degradation amount, and the predicted cycle degradation amount.

For example, the remaining value of the secondary battery 25 is calculated as an amount of money according to a reference value determined for each component of the secondary battery 25 and a map determined using the predicted element degradation states $SOHQ_ap$, $SOHQ_cp$, $SOHQ_{Li}p$, $SOHR_ap$, and $SOHR_cp$. At this time, the value of the reference value may be changed according to the market value related to the secondary battery 25 or the use mode related to the predicted battery load.

In step S10, the battery diagnostic system 1 extracts a recommended handling mode on the basis of information such as the battery states $SOHQ_Be$, $SOHR_Be$, the predicted battery states $SOHQ_Bp$, $SOHR_Bp$, and the rank of the secondary battery 25 and the handling criteria set in step S5.

As information used for extracting the recommended handling mode, the element degradation states $SOHQ_ae$, $SOHQ_ce$, $SOHQ_{Li}e$, $SOHR_ae$, $SOHR_ce$, the calendar degradation amount Za, and the cycle degradation amount Zb may be used. It is also possible to extract the recommended handling mode using the predicted element degradation states $SOHQ_ap$, $SOHQ_cp$, $SOHQ_{Li}p$, $SOHR_ap$, $SOHR_cp$, the predicted calendar degradation amount, and the predicted cycle degradation amount.

In the first embodiment, a recommended handling mode related to a maintenance method of the secondary battery 25 is extracted. Here, the secondary battery 25 is configured by a battery pack in which a plurality of battery modules are unitized.

For this reason, it is conceivable that the heat dissipation performance of the battery module varies depending on the arrangement of the battery modules in the battery pack, and the battery temperature T varies for each battery module. As described above, since the battery temperature T greatly affects the progress of the degradation in the secondary battery 25, there is a difference in the degree of progress of the degradation in each battery module.

The performance of the secondary battery 25 is determined by a battery module having the lowest performance (i.e., battery module in which degradation has progressed the most) among the battery modules included in the battery pack. Therefore, in order to efficiently exhibit the performance of the secondary battery 25, it is important to perform appropriate maintenance. In the first embodiment, the battery diagnostic system 1 presents an appropriate maintenance method in view of the current state of the secondary battery 25 and use in the use mode related to the predicted battery load.

Examples of a maintenance method for the secondary battery 25 include replacement with a used battery pack, replacement with a new battery pack, recombination of battery modules, and replacement of a battery module. Replacement with a used battery pack is a maintenance method of replacing the battery pack itself with a used battery pack. Replacement with a new battery pack is a maintenance method of replacing the battery pack itself with a new battery pack.

Recombination of battery modules is a maintenance method of changing the arrangement of a plurality of battery modules included in a battery pack to increase the performance of the battery pack. Replacement of a battery module is a maintenance method of replacing a battery module in which degradation progresses among the battery modules included in the battery pack with a new or used battery module.

The battery diagnostic system 1 extracts a recommended maintenance method as a recommended handling mode on the basis of information such as the battery states $SOHQ_Be$, $SOHR_Be$, the predicted battery states $SOHQ_Bp$, $SOHR_Bp$, and the rank of the secondary battery 25 and the handling criteria set in step S5.

At this time, when a cost condition or a period condition related to maintenance is set as the handling criteria, the recommended maintenance method is extracted by adding information input from the repair shop F and information input from the dealer D.

Specifically, when the handling criteria includes a cost condition, information on the fee for maintenance input at the repair shop F and information on the price of a part (e.g., battery module) required for maintenance input at the dealer D are referred to. As a result, it is possible to extract a recommended maintenance method that meets the cost condition.

When the handling criteria includes a period condition, information on the work reservation status and the required time related to maintenance input at the repair shop F and information on the delivery date of a part (e.g., battery module) required for maintenance input at the dealer D are referred to. As a result, it is possible to extract a recommended maintenance method that meets the period condition.

When the recommended handling mode is extracted using the predicted battery information or the like, the battery diagnostic system 1 stores information on the recommended handling mode in the storage device 53, and advances the processing to step S11.

In step S11, the battery diagnostic system 1 outputs the diagnosis result obtained by the processing up to step S10. The diagnosis result can include the degradation state of the secondary battery 25 at the present time, the degradation state of the secondary battery 25 when used in the use mode related to the predicted battery load, the recommended handling mode, and the like.

Examples of the degradation state of the secondary battery 25 at the present time include the battery states $SOHQ_Be$, $SOHR_Be$, the element degradation states $SOHQ_ae$, $SOHQ_ce$, $SOHQ_{Li}e$, $SOHR_ae$, $SOHR_ce$, the calendar degradation amount Za, and the cycle degradation amount Zb.

Examples of the degradation state of the secondary battery 25 when used in the use mode related to the predicted battery load include the predicted battery states $SOHQ_Bp$, $SOHR_Bp$, and the predicted element degradation states $SOHQ_ap$, $SOHQ_cp$, $SOHQ_{Li}p$, $SOHR_ap$, $SOHR_cp$. Further, the predicted calendar degradation amount and the predicted cycle degradation amount can also be used.

The output mode of the diagnosis result may be a mode in which the diagnosis result is printed on a paper medium via a printer (not illustrated) or a mode in which the diagnosis result is displayed on a screen of the information terminal 10 owned by each user U or the like. After outputting the diagnosis result, the battery diagnostic system 1 ends the battery diagnosis processing.

As described above, when a portion of the constituent data of the battery load history is missing, the battery diagnostic system 1 according to the first embodiment executes the data interpolation processing in step S23, and estimates and interpolates the portion of the missing constituent data using the rest of the constituent data. As illustrated in FIG. 6, unlike the extrapolation method, in the data interpolation processing, data filling the range of each section of a certain known data sequence is generated on the basis of the known data sequence.

Therefore, in the battery diagnostic system 1, even when a portion of the constituent data of the battery load history is missing, the battery load history can be acquired with high accuracy. Further, in the battery diagnostic system 1, the element degradation state, the battery state, and the cause of degradation of the secondary battery 25 are estimated using the accurate battery load history, and the predicted battery state of the secondary battery 25 to be generated in the future is predicted using the battery state and the cause of degradation and the predicted battery load. Therefore, according to the battery diagnostic system 1, even when a portion of the battery load history is missing, a predicted battery state and the like of the secondary battery 25 in the future can be diagnosed with higher accuracy on the basis of the degradation state of the secondary battery 25 at the present time.

In addition, according to the battery diagnostic system 1, in step S6, when the secondary battery 25 is used according to the future use mode of the secondary battery 25, the predicted battery load identifying the load predicted to be applied to the secondary battery 25 is generated.

As a result, the battery diagnostic system 1 can predict the predicted battery state and the like using the predicted battery load according to the future use mode of the secondary battery 25, and can provide a more accurate diagnosis result related to the degradation of the secondary battery 25.

Further, according to the battery diagnostic system 1, in step S6, the predicted battery load generated according to a learning result using the battery load history can be set, and the predicted battery state and the like using the set predicted battery load can be predicted.

The learning result using the battery load history corresponds to the use mode of the secondary battery 25 performed at a high frequency. Therefore, the battery diagnostic system 1 can set the predicted battery load with the highest feasibility when predicting the predicted battery state and the like, and can provide a prediction result of the predicted battery state and the like with a small burden and with high accuracy.

Further, in step S9, the battery diagnostic system 1 uses the predicted battery state and the like of the secondary battery 25 to evaluate the remaining value of the secondary battery 25 when used in the use mode related to the predicted battery load.

As a result, since the remaining value of the secondary battery 25 in the future can be grasped, the future use mode of the secondary battery 25 can be adjusted by comparison with the use mode related to the predicted battery load, and the remaining value of the secondary battery 25 can be brought close to a desired state.

In step S8, the battery diagnostic system 1 performs ranking using the capacity rank and the resistance rank with respect to the predicted battery state of the secondary battery 25. In step S9, the battery diagnostic system 1 evaluates the remaining value of the secondary battery 25 using the ranking result.

As a result, since the battery diagnostic system 1 evaluates the remaining value of the secondary battery 25 using the ranking result, the evaluation of the remaining value of the secondary battery 25 can be calculated and presented in an easy-to-understand manner.

In addition, according to the battery diagnostic system 1, when ranking the secondary battery 25 in step S8, ranking is performed using the predicted calendar degradation amount and the predicted cycle degradation amount in addition to the capacity rank and the resistance rank.

As a result, the battery diagnostic system 1 can evaluate the remaining value of the secondary battery 25 in more detail by using the predicted calendar degradation amount and the predicted cycle degradation amount. In addition, since the predicted calendar degradation amount and the predicted cycle degradation amount affect how the degradation in the secondary battery 25 progresses thereafter, the remaining value of the secondary battery 25 can be evaluated in detail.

In step S9, the battery diagnostic system 1 calculates the remaining value of the secondary battery 25 as an amount of money using a reference value defined for the components (i.e., negative electrode, positive electrode, and electrolyte) of the secondary battery 25 and the predicted element degradation state.

As a result, the battery diagnostic system 1 can clearly determine the remaining value of the secondary battery 25. In addition, for example, by changing the reference value in conjunction with the market value of the secondary battery 25, the remaining value of the secondary battery 25 corresponding to the change in the market value can be calculated, and the remaining value of the secondary battery 25 can be presented with higher accuracy.

In addition, in step S10, the battery diagnostic system 1 extracts and proposes a handling mode capable of further increasing the remaining value of the secondary battery 25 using the predicted battery state and the like of the secondary battery 25 and a handling criteria.

As a result, according to the battery diagnostic system 1, the remaining value of the secondary battery 25 can be increased by executing the proposed handling mode. In addition, since the handling mode is specifically proposed, the remaining value of the secondary battery 25 can be increased efficiently.

The battery diagnostic system 1 extracts a handling mode in which the remaining value of the secondary battery 25 can be further increased using the handling criteria input in step S5. The setting of the handling criteria in step S5 is input, for example, in the information terminal 10 or the like of the user U.

Therefore, in the battery diagnostic system 1, the intention of the party (e.g., user U) can be reflected in the extraction of the handling mode, and the remaining value of the secondary battery 25 can be increased in a mode desired by the party.

Second Embodiment

Figure 12:
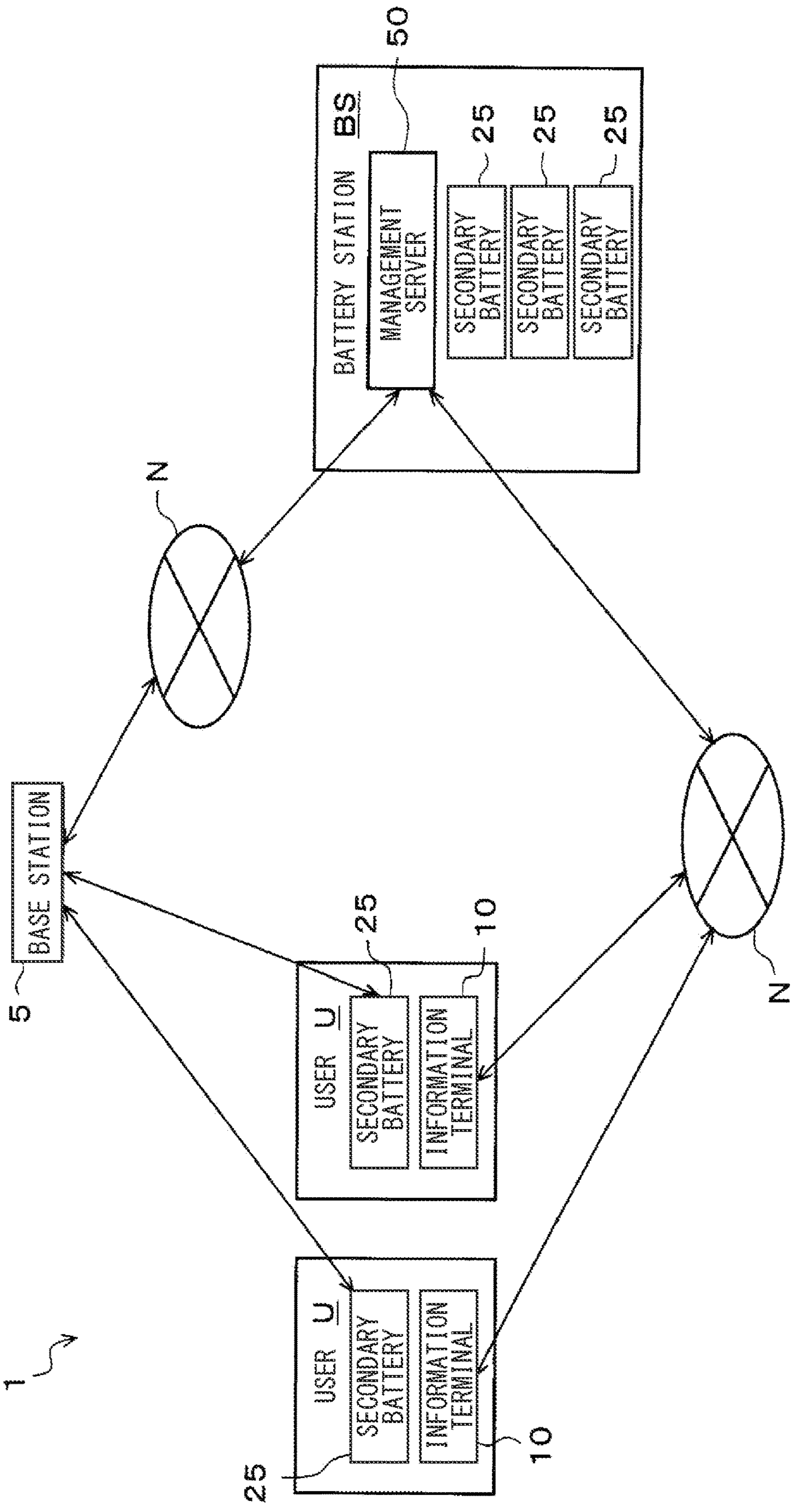
FIG. 12 is a schematic configuration diagram of a battery diagnostic system according to a second embodiment.

Next, a second embodiment different from the above-described embodiment will be described with reference to FIGS. 12 to 14. The second embodiment is different from the first embodiment in the business mode to which a battery diagnostic system 1 is applied. Other basic configurations and the like of the battery diagnostic system 1 are the same as those of the above-described embodiment, and thus, redundant description will be omitted.

The battery diagnostic system 1 according to the second embodiment is applied to a battery station BS that rents secondary batteries 25 owned by the battery station BS to users U and performs maintenance and management of the secondary batteries 25. The battery diagnostic system 1 according to the second embodiment manages the degree of progress of degradation of the secondary batteries 25 in the battery station BS, and makes a proposal for performing maintenance work of the secondary batteries 25 in a desired manner.

First, a configuration of a battery diagnostic system 1 according to the second embodiment will be described. As illustrated in FIG. 12, a management server 50 and the secondary batteries 25 are arranged in the battery station BS. In the battery diagnostic system 1 according to the second embodiment, the user U has the rented secondary battery 25 and the information terminal 10. The configurations of the information terminal 10, the secondary battery 25, and the management server 50 are the same as those of the first embodiment, and thus redundant description will be omitted.

Next, battery diagnosis processing of the battery diagnostic system 1 according to the second embodiment will be described. In the second embodiment, the battery state is calculated, for example, for each battery pack. In step S1 of the second embodiment, a battery load history of the secondary battery 25 rented to the user U or the secondary battery 25 arranged in the battery station BS is acquired.

In steps S2 to S4 of the second embodiment, calculation of an element degradation state, calculation of a battery state, and extraction of a cause of degradation are performed for all the secondary batteries 25 in the battery diagnostic system 1. The content of each processing of steps S2 to S4 is the same as that of the first embodiment.

In step S5 according to the second embodiment, a handling criteria is set. In the second embodiment, a handling criteria as the battery station BS is set using an input device of the management server 50.

The handling criteria according to the second embodiment includes sequential maintenance of sequentially performing maintenance on the plurality of secondary batteries 25 and simultaneous maintenance of simultaneously performing maintenance on all the secondary batteries 25. The handling criteria according to the second embodiment will be described with reference to FIGS. 13 and 14.

Figure 13:
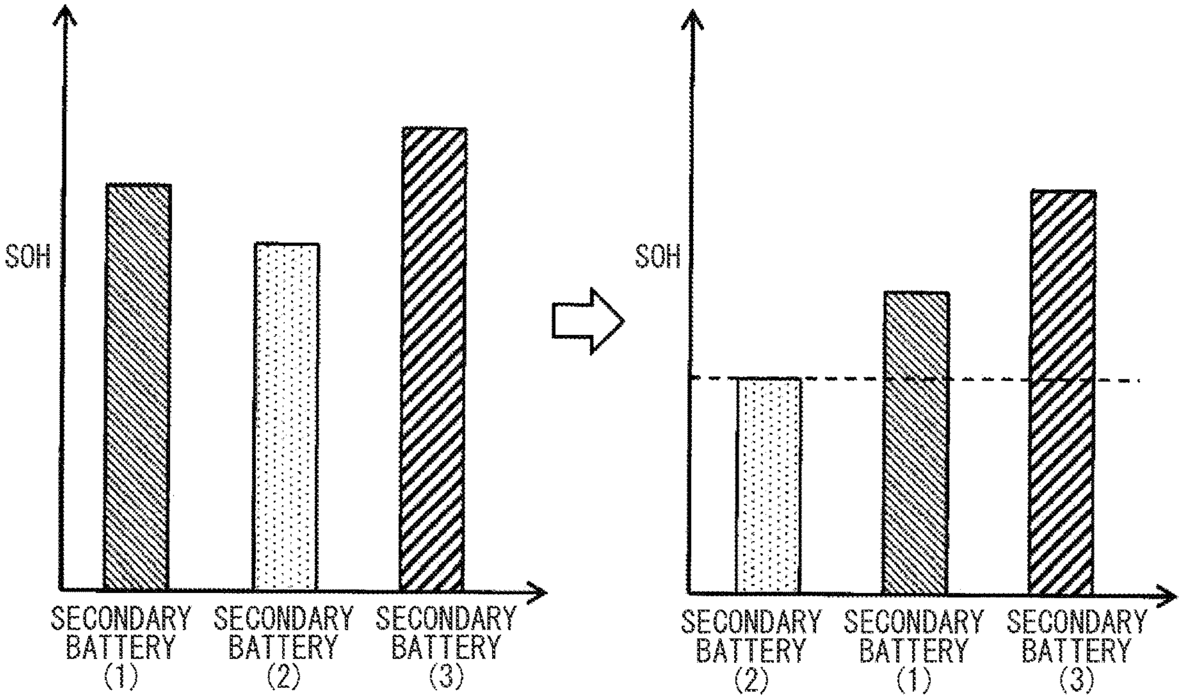
FIG. 13 is an explanatory diagram related to sequential maintenance of a handling criteria in the second embodiment.
Figure 14:
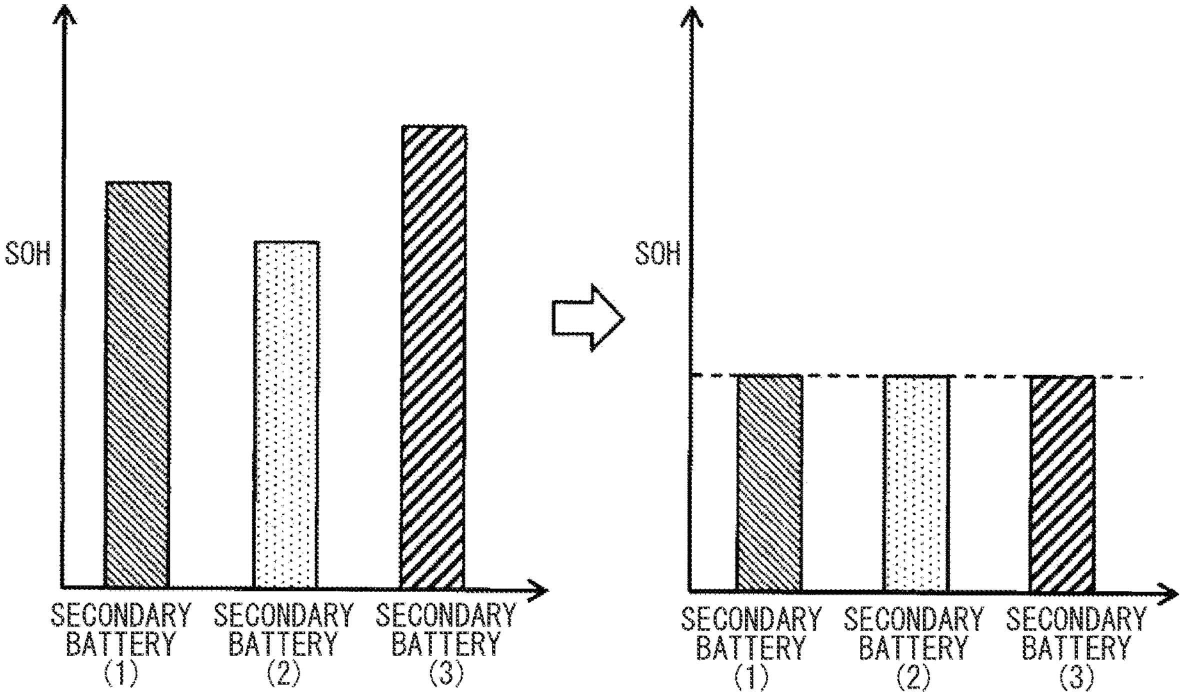
FIG. 14 is an explanatory diagram related to simultaneous maintenance of a handling criteria in the second embodiment.

In the description of FIGS. 13 and 14, for easy understanding, the number of secondary batteries 25 included in the battery diagnostic system 1 is set to three, and the secondary batteries are referred to as a secondary battery (1), a secondary battery (2), and a secondary battery (3). The graph on the left side in FIGS. 13 and 14 illustrates the battery state at the time of shifting to step S5, and the secondary battery (2), the secondary battery (1), and the secondary battery (3) are greatly deteriorated in this order.

First, sequential maintenance will be described as a handling criteria in the second embodiment. As described above, sequential maintenance is a handling criteria determined such that the secondary batteries 25 of the battery diagnostic system 1 are divided into a plurality of groups, and maintenance of the secondary batteries 25 is sequentially performed for each group. Therefore, as the handling mode when sequential maintenance is set, combinations of the secondary battery 25 and the user U who uses the secondary battery 25 are determined such that the degradation amount specified in the predicted battery state differs for each group.

For example, in the example illustrated in FIG. 13, the combinations of the secondary battery 25 and the user U are determined such that, as a result of use according to the predicted battery load, the secondary battery (2), the secondary battery (1), and the secondary battery (3) reach the degradation amount serving as the maintenance reference in this order.

Next, simultaneous maintenance which is a handling criteria in the second embodiment will be described. As described above, simultaneous maintenance is a handling criteria determined such that maintenance is performed simultaneously on all the secondary batteries 25 of the battery diagnostic system 1. Therefore, as the handling mode when simultaneous maintenance is set, combinations of the secondary battery 25 and the user U who uses the secondary battery 25 are determined such that the degradation amount specified in the predicted battery state are the same for all the secondary batteries 25.

For example, in the example illustrated in FIG. 14, the combinations of the secondary battery 25 and the user U are determined such that, as a result of use according to the predicted battery load, all of the secondary battery (1), the secondary battery (2), and the secondary battery (3) simultaneously reach the degradation amount serving as the maintenance reference.

In step S6 according to the second embodiment, a predicted battery load is generated on the basis of the input future use mode of the secondary battery 25 in the information terminal 10 of each user U, and is set as the predicted battery load for the secondary battery 25.

In steps S7 to S9 according to the second embodiment, calculation of the predicted battery state using the set predicted battery load, execution of ranking, and evaluation of the remaining value are performed. These points are the same as those of the first embodiment, and thus redundant description will be omitted.

In step S10 according to the second embodiment, the battery diagnostic system 1 extracts a recommended handling mode on the basis of information such as the battery states $SOHQ_{B}e$, $SOHR_{B}e$, the predicted battery states $SOHQ_{B}p$, $SOHR_{B}p$, and the rank of the secondary battery 25 and the handling criteria set in step S5.

For example, when sequential maintenance is set as the handling criteria, as illustrated on the right side of FIG. 13, the recommended handling mode that defines the combinations of the secondary battery 25 and the user U who uses the secondary battery 25 is determined such that the degradation amount specified in the predicted battery state differs for each group.

Alternatively, when simultaneous maintenance is set as the handling criteria, as illustrated on the right side of FIG. 14, the recommended handling mode that defines the combinations of the secondary battery 25 and the user U is determined such that the degradation amounts specified in the predicted battery states in all the secondary batteries 25 are equal. After the recommended handling mode is extracted, the processing proceeds to step S11.

In step S11, the battery diagnostic system 1 outputs the diagnosis result obtained by the processing up to step S10. The diagnosis result can include the degradation state of the secondary battery 25 at the present time, the degradation state of the secondary battery 25 when used in the use mode related to the predicted battery load, the recommended handling mode, and the like. In the second embodiment, the battery station BS is determined as an output destination of the diagnosis result. As an output mode, the output may be displayed on a display arranged in the battery station BS, or may be printed and output to a paper medium.

As described above, even in a case where the battery diagnostic system 1 according to the second embodiment is applied to a business mode such as the battery station BS, the same effects as those of the above-described embodiment can be obtained from the same configuration as that of the above-described embodiment.

Third Embodiment

Figure 15:
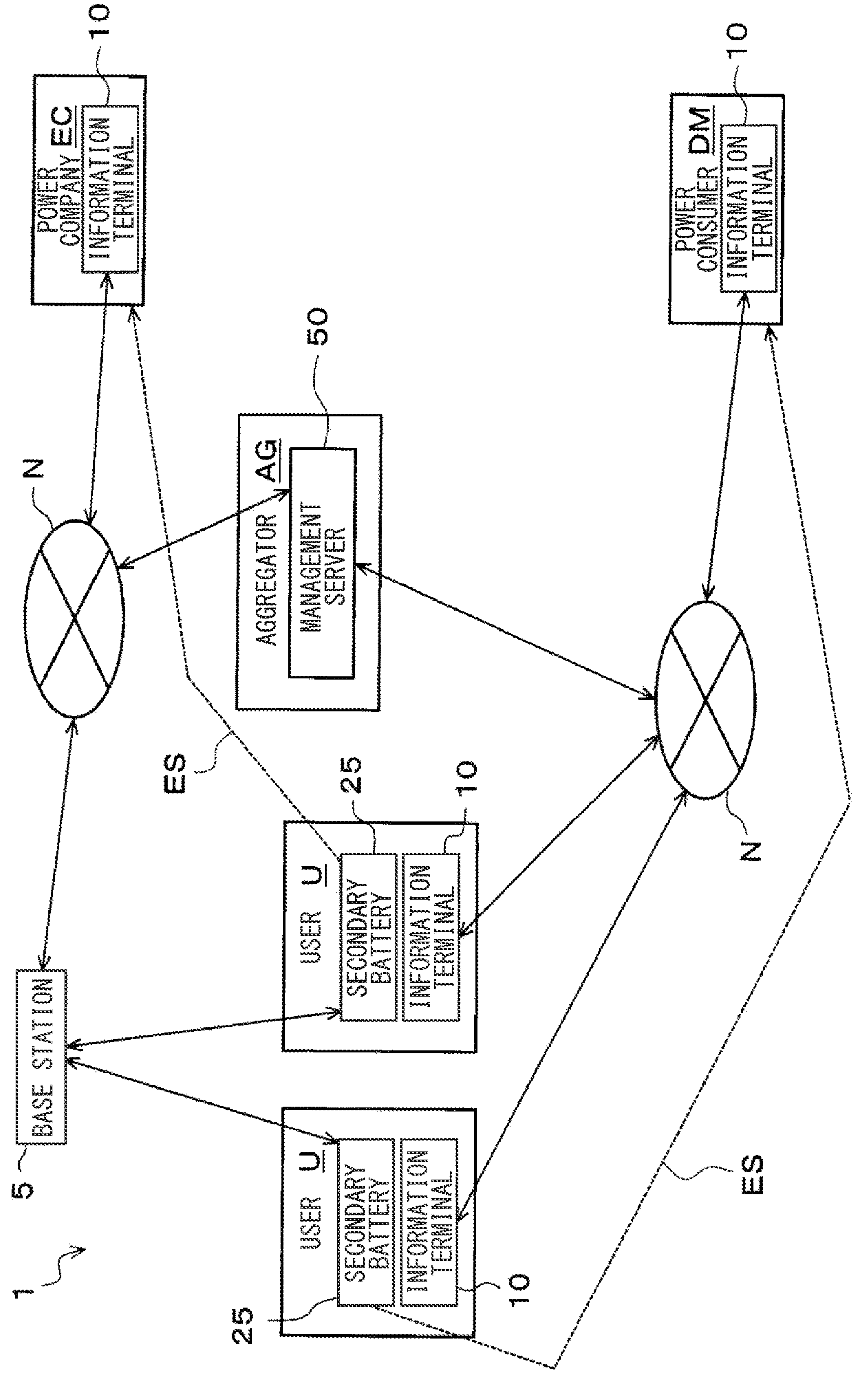
FIG. 15 is a schematic configuration diagram of a battery diagnostic system according to a third embodiment.

Next, a third embodiment different from the above-described embodiments will be described with reference to FIGS. 15 and 16. The third embodiment is different from the above-described embodiment in the business mode to which a battery diagnostic system 1 is applied. Other basic configurations and the like of the battery diagnostic system 1 are the same as those of the above-described embodiment, and thus, redundant description will be omitted.

The battery diagnostic system 1 according to the third embodiment is applied to an aggregator AG that arbitrates the power of a secondary battery 25 owned by a user U and the electric power demand of an electric power company EC or an electric power consumer DM in a well-balanced manner.

The battery diagnostic system 1 according to the third embodiment responds to the electric power demand of the electric power company EC and the electric power consumer DM, and performs arbitration so as to appropriately balance the profit and the progress of degradation accompanying the selling of power from the secondary battery 25 for each user U. In FIG. 15, electric power supply ES and the electric power supply ES to the electric power consumer DM from the secondary battery 25 of the user U are indicated by a broken line.

In the battery diagnostic system 1 according to the third embodiment, there is proposed a point of effectively increasing the profit by selling surplus power by the user U. This point will be described using power balance for a certain user U as an example.

Figure 16:
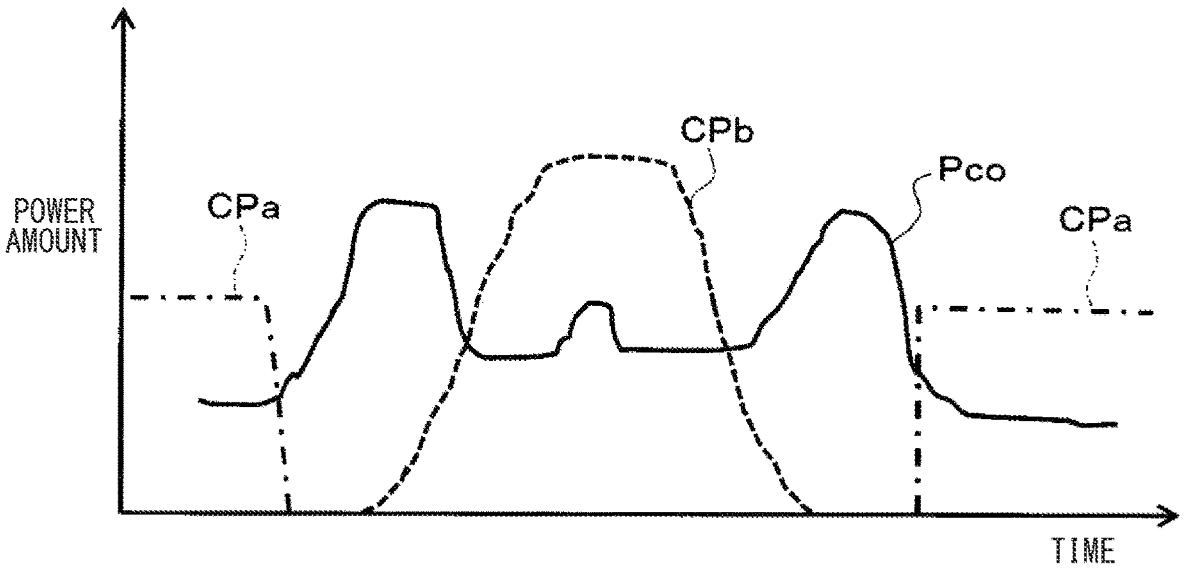
FIG. 16 is an explanatory diagram illustrating an example of a power balance according to a third embodiment.

FIG. 16 illustrates time-series changes in a power consumption amount Pco of a certain user U and the charged power amount of the secondary battery 25. The user U owns two secondary batteries 25, which are referred to as a secondary battery (A) and a secondary battery (B). In FIG. 16, the charged power amount of the secondary battery (A) is referred to as a charged power amount CPa, and the charged power amount of the secondary battery (B) is referred to as a charged power amount CPb.

In the case of this specific example, it can be seen that surplus power is generated from the relationship between the charged power amount CPa and the power consumption amount Pco and the relationship between the charged power amount CPb and the power consumption amount Pco. The battery diagnostic system 1 according to the third embodiment is configured to effectively utilize surplus power of the user U to provide a profit to the user U.

Next, a configuration of the battery diagnostic system 1 according to a third embodiment will be described. As illustrated in FIG. 15, a management server 50 is arranged in the aggregator AG. In the battery diagnostic system 1 according to the third embodiment, the user U has the secondary battery 25 owned by the user U and an information terminal 10.

The electric power company EC and the electric power consumer DM also have the information terminal 10. The information terminals 10 of the electric power supply ES and the electric power consumer DM are used to input information regarding the electric power demand thereof. The configurations of the information terminal 10, the secondary battery 25, and the management server 50 are the same as those of the above-described embodiment, and thus redundant description will be omitted.

Next, battery diagnosis processing of the battery diagnostic system 1 according to the third embodiment will be described. In the third embodiment, the battery state is calculated for each battery pack. In step S1 of the third embodiment, a battery load history of the secondary battery 25 owned by the user U is acquired and transmitted to the management server 50. The battery load history according to the third embodiment also includes information on power selling to the electric power company EC and the electric power consumer DM.

In steps S2 to S4 of the third embodiment, calculation of an element degradation state, calculation of a battery state, and extraction of a cause of degradation are performed for all the secondary batteries 25 in the battery diagnostic system 1. The content of each processing of steps S2 to S4 is the same as that of the above-described embodiment.

In step S5 of the third embodiment, a handling criteria related to power arbitration is set. The handling criteria according to the third embodiment defines an appropriate combination of electric power demand and electric power supply from the viewpoint of the cost of the remaining value of the secondary battery 25 owned by the user U and the cost of selling power to the electric power company EC and the electric power consumer DM.

In step S6 according to the third embodiment, the information terminal 10 of the user U generates a predicted battery load related to power consumption of the user U on the basis of the input future use mode of the secondary battery 25. In addition, a predicted battery load related to the power selling of the user U is generated in association with the input of the electric power demand and the power purchase price in the information terminal 10 of the electric power company EC and the electric power consumer DM.

In steps S7 to S9 according to the third embodiment, calculation of the predicted battery state using the set predicted battery load, execution of ranking, and evaluation of the remaining value are performed. These points are the same as those of the above-described embodiment, and thus redundant description will be omitted.

In step S10 according to the third embodiment, the battery diagnostic system 1 extracts a recommended handling mode on the basis of information such as battery states $SOHQ_Be$, $SOHR_Be$, predicted battery states $SOHQ_Bp$, $SOHR_Bp$, and the rank of the secondary battery 25 and the handling criteria set in step S5.

For example, when the recommended handling mode is described according to the example illustrated in FIG. 16, a handling mode in which surplus power of the secondary battery (B) is used as charging power of the secondary battery (A) can be considered as a recommended handling mode. Moreover, a handling mode in which surplus power of the secondary battery (B) is sold to the electric power company EC or the electric power consumer DM which is an external electric power system can be assumed as a recommended handling mode. After extracting the recommended handling mode, the battery diagnostic system 1 shifts the processing to step S11.

In step S11, the battery diagnostic system 1 outputs the diagnosis result obtained by the processing up to step S10. The diagnosis result can include the degradation state of the secondary battery 25 at the present time, the degradation state of the secondary battery 25 when used in the use mode related to the predicted battery load, the recommended handling mode, and the like. In the third embodiment, the user U who is a party of power arbitration is determined as an output destination of the diagnosis result. As an output mode, the output may be displayed on a display of the information terminal 10 owned by the user U, or may be printed and output to a paper medium.

According to the battery diagnostic system 1 according to the third embodiment, even in a case where the battery diagnostic system 1 is applied to the aggregator AG that performs power arbitration using the power of the secondary battery 25, the same effects as those of the above-described embodiment can be obtained from the same configuration as that of the above-described embodiment.

Fourth Embodiment

Figure 17:
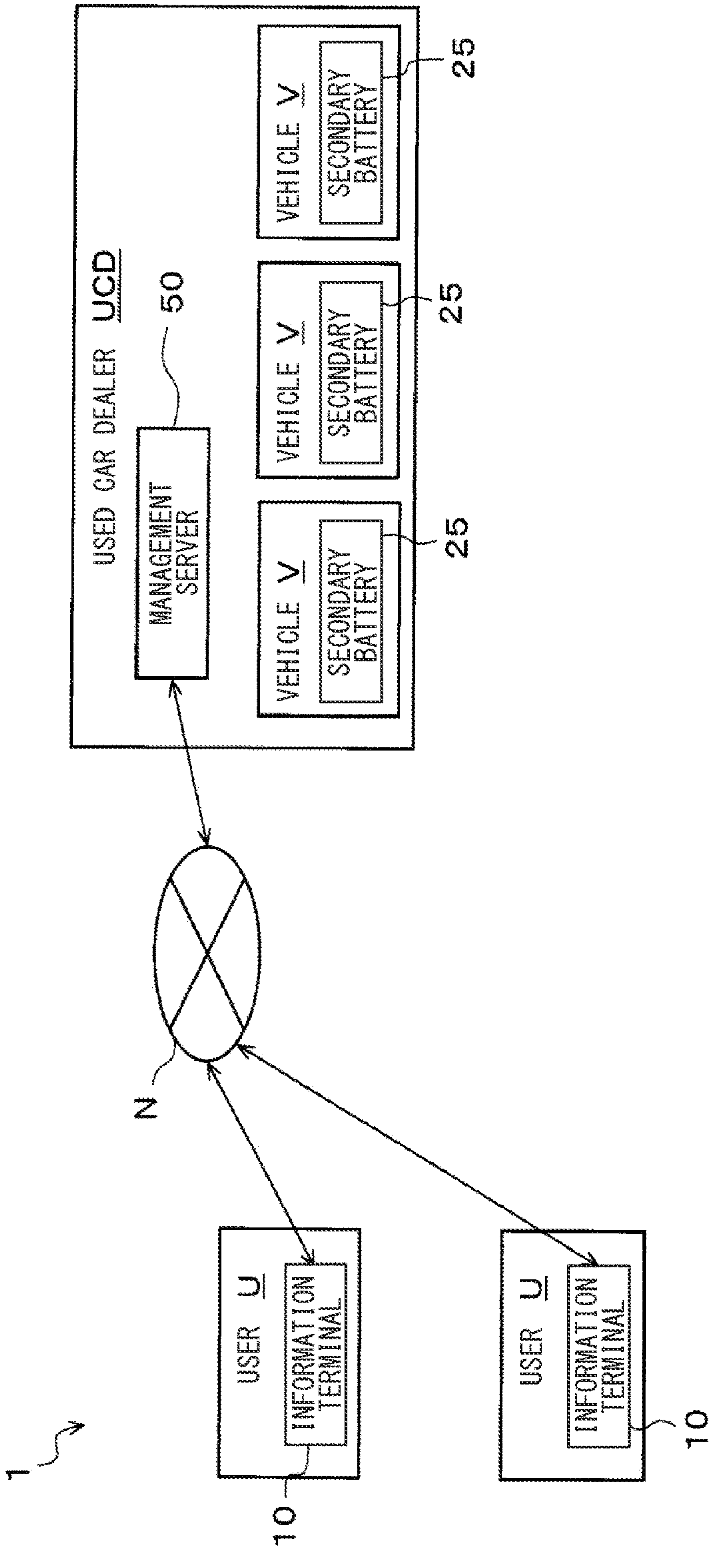
FIG. 17 is a schematic configuration diagram of a battery diagnostic system according to a fourth embodiment.

Next, a fourth embodiment different from the above-described embodiment will be described with reference to FIG. 17. The fourth embodiment is different from the above-described embodiment in the business mode to which a battery diagnostic system 1 is applied. Other basic configurations and the like of the battery diagnostic system 1 are the same as those of the above-described embodiment, and thus, redundant description will be omitted.

The battery diagnostic system 1 according to the fourth embodiment is applied to a used car dealer UCD that sells a vehicle V equipped with a secondary battery 25 to a user U. The battery diagnostic system 1 according to the fourth embodiment is configured to diagnose a degradation state of the secondary battery 25 for vehicles V owned by the used car dealer UCD, and propose the vehicle V corresponding to a use mode and a degradation state desired by the user U.

Next, a configuration of the battery diagnostic system 1 according to the fourth embodiment will be described. As illustrated in FIG. 17, the used car dealer UCD has a management server 50 and the vehicles V (i.e., electric vehicles) equipped with the secondary battery 25.

In addition, each user U in the fourth embodiment has an information terminal 10. The user U inputs information such as a use schedule after purchase, a required travel distance, and a life of the secondary battery 25 using the information terminal 10. The information input by the user U is transmitted to the management server 50 of the used car dealer UCD, and forms a predicted battery load and a handling criteria. The configurations of the information terminal 10, the secondary battery 25, and the management server 50 are the same as those of the above-described embodiment, and thus redundant description will be omitted.

Next, battery diagnosis processing of the battery diagnostic system 1 according to the fourth embodiment will be described. In the fourth embodiment, the battery state is calculated for each battery pack. In step S1 of the fourth embodiment, a battery load history of the secondary battery 25 owned by the used car dealer UCD is acquired.

In steps S2 to S4 of the fourth embodiment, calculation of an element degradation state, calculation of a battery state, and extraction of a cause of degradation are performed for the secondary battery 25 of the vehicle V. The content of each processing of steps S2 to S4 is the same as that of the above-described embodiment.

In step S5 of the fourth embodiment, a handling criteria is set on the basis of an input to the information terminal 10 of the user U. The handling criteria according to the fourth embodiment is configured by a condition requested by the user U for the vehicle V to be purchased. Therefore, information forming the handling criteria includes a vehicle type, a year of manufacture, a travel distance, a scheduled use period, a use purpose, and the like.

In step S6 according to the fourth embodiment, the information terminal 10 of the user U generates a predicted battery load on the basis of the input future use mode of the secondary battery 25. In steps S7 to S9 according to the fourth embodiment, calculation of the predicted battery state using the set predicted battery load, execution of ranking, and evaluation of the remaining value are performed. These points are the same as those of the above-described embodiment, and thus redundant description will be omitted.

In step S10 according to the fourth embodiment, the battery diagnostic system 1 extracts a recommended handling mode on the basis of information such as battery states $SOHQ_{B}e$, $SOHR_{B}e$, predicted battery states $SOHQ_{B}p$, $SOHR_{B}p$, and the rank of the secondary battery 25 and the handling criteria set in step S5. In this case, the battery diagnostic system 1 extracts information of the vehicle V that meets the handling criteria input by the user U as a recommended handling mode from among the vehicles V owned by the used car dealer UCD. After extracting the recommended handling mode, the battery diagnostic system 1 shifts the processing to step S11.

As the recommended handling mode, information on a plurality of vehicles V conforming to the handling criteria may be extracted. Further, as the information of the extracted vehicle V, information of a sales price as a used vehicle may be added.

In step S11, the battery diagnostic system 1 outputs the diagnosis result obtained by the processing up to step S10. The diagnosis result can include, in addition to the information of the vehicle V, the degradation state of the secondary battery 25 at the present time, the degradation state of the secondary battery 25 when used in the use mode related to the predicted battery load, the recommended handling mode, and the like. In the fourth embodiment, the user U who is a purchaser is determined as an output destination of the diagnosis result. As an output mode, the output may be displayed on a display of the information terminal 10 owned by the user U, or may be printed and output to a paper medium.

According to the battery diagnostic system 1 according to the fourth embodiment, even in a case where the battery diagnostic system 1 is applied to the used car dealer UCD related to the vehicle V equipped with the secondary battery 25, the same effects as those of the above-described embodiment can be obtained from the same configuration as that of the above-described embodiment.

The used car dealer UCD according to the fourth embodiment is a mode of selling the vehicle V owned by the used car dealer UCD to the user U who is a consumer, but the present invention is not limited to this mode. For example, the battery diagnostic system 1 can be applied to a used car dealer UCD in a mode of mediating between the user U who is the seller and the user U who is the purchaser. In this case, the battery load history is acquired from the user U who is the seller, and information necessary for generating the handling criteria and the predicted battery load is set by the input from the user U who is the purchaser. Even when the battery diagnostic system 1 is applied to the intermediatetype used car dealer UCD, the same effects as those of the fourth embodiment can be exhibited.

The present disclosure is not limited to the embodiments, and can be variously modified as follows without departing from the gist of the present disclosure.

A business mode to which the battery diagnostic system 1 of the present disclosure can be applied is not limited to the above-described embodiments. The present invention can be applied to various business modes while the business mode is premised on the use of the secondary battery 25. For example, the battery diagnostic system 1 may be applied as a method of making an estimate when the used car dealer UCD purchases a battery vehicle owned by the user U. In this case, the user U can grasp the degradation state, the remaining value, and the like of the secondary battery 25, and thus can determine the validity of the assessed price issued by the used car dealer UCD.

In the embodiments, the vehicle V using the electric power of the secondary battery 25 as a driving source is adopted as the device using the secondary battery 25, but the used device is not limited to this mode. If the battery load history can be acquired, various modes can be adopted as the device using the secondary battery 25. The use device forming the battery diagnostic system 1 is not limited to one type (e.g., vehicle), and plural types of devices can be adopted while the devices can acquire the battery load history.

In addition, the number of secondary batteries 25 included in the battery diagnostic system 1 and the type of predicted battery load, which is a future use mode of the secondary battery 25, are not limited to the above-described embodiments. The number of the secondary batteries 25 and the type of the predicted battery load can be appropriately changed according to the calculation load of the predicted battery state and the like and the performance of the management server 50.

In the evaluation of the remaining value in step S9, the method of evaluating the remaining value of the secondary battery 25 is not limited to the above-described embodiments. As a method for evaluating the remaining value of the secondary battery 25 in the battery diagnostic system 1, various methods can be adopted while the remaining value of the secondary battery 25 can be evaluated.

While the present disclosure has been described in accordance with examples, it is understood that the present disclosure is not limited to the examples and structures. The present disclosure also includes various modifications and examples within an equivalent range. In addition, various combinations and modes, and other combinations and modes including only one element, more elements, or less elements are also within the scope and idea of the present disclosure.

What is claimed is:

1. A battery diagnostic system comprising:

a load history acquisition unit configured to acquire a battery load history which is a history of a load applied to a secondary battery;

an interpolation processing unit configured to, when a portion of constituent data of the battery load history is missing, estimate and interpolate the portion of constituent data using the rest of the constituent data;

a degradation estimation unit configured to estimate, based on the battery load history, a present degradation state of the secondary battery and a cause of degradation that has brought about the degradation state;

a degradation prediction unit configured to predict a predicted degradation state of the secondary battery that will occur in a future upon having been used in a future use mode of the secondary battery for diagnosis, using a predicted battery load indicating a load predicted to be applied to the secondary battery according to the future use mode of the secondary battery and the present degradation state and the cause of degradation of the secondary battery estimated by the degradation estimation unit; and an output unit configured to output the predicted degradation state of the secondary battery predicted by the degradation prediction unit, wherein the interpolation processing unit calculates a temperature of the secondary battery as the portion of constituent data using following formula (1) and formula (2):

$$T_n = T_{n-1} + \Delta T_n \quad (1)$$

$$\Delta T_n = \frac{(T_{n-1} - Tam_{n-1})}{R} \times \frac{\Delta t}{C} \quad (2)$$

in which $T_n$ (n=1 to N) represents the temperature of the secondary battery, $Tam_n$ (n=1 to N) represents an outside temperature around the secondary battery, R represents an outside air heat dissipation resistance of the secondary battery, Δt represents a sampling cycle, and C represents a heat capacity of the secondary battery.

2. The battery diagnostic system according to claim 1, further comprising a predicted load generation unit configured to, when the secondary battery is used according to the future use mode of the secondary battery, identify a load predicted to be applied to the secondary battery and generate the predicted battery load.

3. The battery diagnostic system according to claim 2, wherein the predicted load generation unit generates the predicted battery load when the secondary battery is used in the use mode corresponding to the battery load history according to a learning result using the battery load history.

4. The battery diagnostic system according to claim 1, further comprising a remaining value evaluation unit configured to evaluate a remaining value of the secondary battery when used in the future use mode, by using the predicted degradation state of the secondary battery predicted by the degradation prediction unit.

5. The battery diagnostic system according to claim 4, further comprising a rank identifying unit configured to rank the secondary battery with respect to the predicted degradation state of the secondary battery using a state of a battery component of the secondary battery predicted by the degradation prediction unit, wherein the remaining value evaluation unit evaluates a remaining value of the secondary battery using a rank of the secondary battery determined by the rank identifying unit.

6. The battery diagnostic system according to claim 5, wherein the rank identifying unit ranks the secondary battery with respect to the predicted degradation state of the secondary battery using the cause of degradation of the secondary battery predicted by the degradation prediction unit in addition to the state of the battery component of the secondary battery.

7. The battery diagnostic system according to claim 4, wherein the remaining value evaluation unit calculates the remaining value of the secondary battery as an amount of money using a reference value determined for a battery component of the secondary battery and a state of the battery component of the secondary battery predicted by the degradation prediction unit.

8. The battery diagnostic system according to claim 4, further comprising a proposal unit configured to propose a future handling mode of the secondary battery to increase the remaining value of the secondary battery using the remaining value of the secondary battery evaluated by the remaining value evaluation unit and a handling criteria related to future handling of the secondary battery.

9. The battery diagnostic system according to claim 8, further comprising a condition input unit to which the handling criteria related to future handling of the secondary battery is input, wherein the proposal unit proposes a future handling mode of the secondary battery to increase the remaining value of the secondary battery using the handling criteria input to the condition input unit.

10. The battery diagnostic system according to claim 1, wherein the degradation prediction unit estimates a calendar degradation amount caused by calendar aging that progresses with lapse of time regardless of energization to the secondary battery and further progresses by increasing a temperature of the secondary battery, and a cycle degradation amount caused by cycle aging that progresses by energization of the secondary battery and further progresses by energization in a state where a temperature of the secondary battery is lower than a predetermined value, and the degradation prediction unit estimates the cause of the present degradation state of the secondary battery using the calendar degradation amount and the cycle degradation amount in the present degradation state of the secondary battery.

* * * * *